United States Patent
Kuma et al.

(10) Patent No.: US 7,233,104 B2
(45) Date of Patent: Jun. 19, 2007

(54) COLOR EMISSION DEVICE

(75) Inventors: Hitoshi Kuma, Sodegaura (JP);
Mitsuru Eida, Sodegaura (JP); Chishio Hosokawa, Sodegaura (JP); Kenichi Fukuoka, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 145 days.

(21) Appl. No.: 10/507,843

(22) PCT Filed: Mar. 7, 2003

(86) PCT No.: PCT/JP03/02708

§ 371 (c)(1),
(2), (4) Date: Sep. 15, 2004

(87) PCT Pub. No.: WO03/079735

PCT Pub. Date: Sep. 25, 2003

(65) Prior Publication Data

US 2005/0116619 A1    Jun. 2, 2005

(30) Foreign Application Priority Data

Mar. 15, 2002   (JP)   ............... 2002-073234
Mar. 15, 2002   (JP)   ............... 2002-073324
Mar. 29, 2002   (JP)   ............... 2002-097812

(51) Int. Cl.
*H01J 1/62* (2006.01)
(52) U.S. Cl. ............... 313/501; 313/503; 313/506; 313/112
(58) Field of Classification Search .......... 313/501, 313/503, 506, 112
See application file for complete search history.

(56) References Cited

U.S. PATENT DOCUMENTS

| | | | | |
|---|---|---|---|---|
| 5,909,081 A | * | 6/1999 | Eida et al. | 313/504 |
| 6,037,712 A | * | 3/2000 | Codama et al. | 313/498 |
| 6,084,347 A | | 7/2000 | Xu et al. | 313/503 |
| 6,121,726 A | * | 9/2000 | Codama et al. | 313/504 |
| 6,608,439 B1 | * | 8/2003 | Sokolik et al. | 313/512 |
| 6,653,778 B1 | * | 11/2003 | Tomiuchi et al. | 313/501 |
| 6,844,670 B2 | * | 1/2005 | Kuma et al. | 313/501 |

FOREIGN PATENT DOCUMENTS

| | | |
|---|---|---|
| JP | 60-220597 | 11/1985 |
| JP | 10-039791 | 2/1998 |
| JP | 10-162958 | 6/1998 |
| JP | 10-177895 | 6/1998 |
| JP | 10-255983 | 9/1998 |
| JP | 2000-182780 | 6/2000 |

* cited by examiner

*Primary Examiner*—Robert Pascal
*Assistant Examiner*—Kimberly E Glenn
(74) *Attorney, Agent, or Firm*—Steptoe & Johnson LLP

(57) ABSTRACT

An organic EL element (200) emits light containing a blue component (B) and a component (θ) with a peak in 500 to 600 nm. A red converting member (360) has an excitation spectrum with a peak in 500 to 600 nm. The red converting member receives light from the organic EL element (200) and converts the blue component (B) to a red component (R). At this time, the luminance of the red component (R) is enhanced since the member (360) is strongly excited by the component (θ). As a result, the white balance of three colors is improved. Therefore a color emission device (100) can be provided where the intensity of red light is enhanced.

9 Claims, 15 Drawing Sheets

(A)

(B)

1: 1:0
2: 0.9:0.1
3: 0.8:0.2
4: 0.7:0.3
5: 0.6:0.4
6: 0.5:0.5
7: 0.4:0.5

E1: Example 1
E2: Example 2
E3: Example 3
E4: Example 4
C1: Comparative Example 1
C2: Comparative Example 2

(A)

(B)

(C)

(D)

(E)

(F)

COLOR EMISSION DEVICE

TECHNICAL FIELD

This invention relates to a color emission device, particularly a color emission device suitable for a color display, which device uses an organic electroluminescence element (organic EL element).

BACKGROUND ART

When making color emission devices such as televisions or color display elements used in displays for computers, portable telephones and so on by using luminescence elements such as organic EL elements, pixels emitting light of three primary colors, blue, green and red must be formed. There are the following roughly classified three ways for the formation of three pixels but these ways have the following problems.

A. Three Color Applying Way

This way is to arrange blue, green and red luminescence elements on a screen respectively.

However it is difficult to obtain a color emission device with a high efficiency and small change in white balance with time, since the pixels of three colors have different durability, particularly red pixels have a short durability and low efficiency.

B. Combination of White Organic EL Element and Color Filter

This way is to obtain blue, green and red color from white emission containing all the three primary colors by using color filters.

Here, "a color filter" is defined as a filter that cuts off a part of emission components but transmits only a desired component emitted from an organic EL element. In order to obtain a color emission device with a high efficiency and excellent color balance in this way, it is essential to use a white organic EL element having a good balance of emission components of the three primary colors. However in order to contain a red component in higher intensity than blue and green components, an element of very complicated structure is required. As a result, it is difficult to manufacture devices with a good reproducibility.

C. Combination of Blue or Bluish Green Organic EL Element and Color Converting Member (Color Converting Way)

This way is to emit light of the three primary colors by converting blue emission to green and red emissions by color converting members.

In order to obtain a color emission device with a high efficiency and excellent color balance in this way, it is essential to develop color converting members capable of efficiently converting light emitted from an organic EL element, particularly a red converting member, and an organic EL element capable of efficiently emitting blue or bluish green light.

FIG. 16 is a diagram showing a color emission device using the conventional color converting way. In this figure, numeral 10 denotes a color emission device, 12 a blue pixel, 14 a green pixel, 16 a red pixel, 20 an organic EL element emitting blue light, 30 a color converting member containing fluorescent dyes. A fluorescent dye is excited once it is irradiated by light having a certain wavelength, and it converts the light to fluorescence having a longer wavelength. The color converting member 30 contains a red converting member 36 and a green converting member 34. The green converting member 34 converts blue light emitted from the organic EL element 20 to green light. The red converting member 36 converts blue light to red light. That is, part of blue light emitted from the organic EL element 20 is converted to green light and red light by the color converting member 30 to provide pixels of the three primary colors, thereby enabling the formation of color emission device.

However in a color emission device thus constructed, the efficiency of converting blue light to red light is lower than that of converting blue light to green light, since the energy gap is larger when converting blue light to red light. That is, the intensity of red light is lower than those of blue light and green light.

Accordingly, some methods are suggested to enhance a red converting efficiency, thereby increasing the intensity of red light.

For example, JP-A No. H10-039791 discloses that red, blue and green pixels have different area ratios or red pixels have larger area ratio so that the intensity or luminance of red light is enhanced, thereby maintaining white balance for long time. However the arrangement pattern of pixels is complicated since the area ratios of color pixels are different from each other.

It is attempted to make a voltage or current for driving organic EL elements in red pixels higher than those of other pixels, thereby letting the luminance thereof higher than those of organic EL elements in green and blue pixels.

However if only the luminance of red pixels is increased, only the organic EL elements in the red pixels are degraded so that the luminance of red pixels cannot be maintained high.

As stated above, various improvements have been done to increase the efficiency of a blue organic EL element insofar but they reach close to the theoretical limit.

In a red converting member, a fluorescent dye that absorbs an emission component from an organic EL element to emit red fluorescence is dispersed in a transparent binder. However there is no combination of fluorescent dye and binder that can satisfy both high converting efficiency and reliability against environment such as heat and light among known dyes and binders at present. If an attempt is made to obtain a high converting efficiency, the material is inevitably unstable for environment. If an attempt is made to obtain a high reliability, its converting efficiency is inevitably reduced.

Further the degradation of a red converting member adversely affects the color stability of whole the color emission device.

Color filters are effectively used to obtain a sufficient reproducibility since they can remove unnecessary emission components that deteriorate color purity. However in the above method, the luminescent efficiency of an organic EL element and converting efficiency of color converting member reach the limits. Thus, if color filters are used to remove unnecessary light for the improvement of color purity, the luminescent efficiency of a color emission device becomes extremely low.

The invention has been made to solve the above-mentioned problems. An object of the invention is to provide a color emission device where the intensity of red light can be increased, while suppressing polarization of degradation in an organic EL element without the different area ratios of pixels from each other.

Another object of the invention is to provide a color emission device with excellent color purity, luminescent efficiency and long durability.

The inventors have been made efforts. As a result they made the invention by the finding that the intensity of red light can be increased by letting the emission spectrum peak of an organic EL element to coincide with the excitation spectrum peak of a red converting member.

Further they made the invention by the finding that the color purity, luminescent efficiency and durability of a color emission device can be enhanced by combining color converting members with a luminescence element emitting light that has a blue component and a yellow to red component at a luminescence intensity ratio of 9:1 to 5:5.

DISCLOSURE OF THE INVENTION

According to a first aspect of the invention, there is provided a color emission device comprising: an organic EL element that emits light having an emission spectrum with peaks in a blue range and a range other than the blue range, a blue pixel containing a blue filter that transmits blue light, a green pixel containing a green converting member that converts at least a part of light emitted from the organic EL element to green light, and a green filter that transmits green light, and a red pixel containing a red converting member that converts at least a part of light emitted from the organic EL element to red light, and a red filter that transmits red light, at least one peak of an excitation spectrum of the red converting member coinciding with the peak in the range other than the blue range of the organic EL element.

Here the coincidence means that a peak wavelength that is a maximum of a spectrum curve substantially coincides with another peak wavelength. The difference therebetween is 10 nm or less, preferably 5 nm or less.

According to the invention, the number of effective photons that contribute to light emission of a red converting member can increase because a peak of emission spectrum of organic EL element coincides with that of excitation spectrum of color converting member in red pixels. As a result, the luminescence intensity, that is, luminance of red pixels can be enhanced.

Consequently the red intensity can be high even if the same voltage is applied to each color pixel. Further imbalanced deterioration of the organic EL element can be suppressed and high red intensity can be maintained for long time. In addition, the luminance of the color emission device can be maintained high for long time without a complicated pixel pattern.

The color emission device of the invention may have each color filter that cuts off unnecessary color components, thereby improving the reproducibility of each color.

The ratio of the peak intensity in the blue range to that in the range other than the blue range in the emission spectrum is preferably 9:1 to 5:5.

If the ratio exceeds 9:1, the luminescence intensity of red light may decrease and therefore the white balance may not be obtained in the color emission device.

If the ratio is less than 5:5, the white balance may not be obtained in the color emission device since the luminescence intensity of red light is high but that of blue pixels relatively decreases.

Thus if the ratio is within the range from 9:1 to 5:5, the luminescence intensity (luminance) of red pixels relatively increases, thereby ensuring the white balance in the color emission device.

The peak in the blue range is preferably a peak in 400 to 500 nm, and the peak in the range other than the blue range is preferably a peak in 500 to 600 nm.

The peak in the blue range is more preferably in 430 to 490 nm, particularly preferably in 440 to 480 nm.

The peak out of the blue range is more preferably in 520 to 570 nm, particularly preferably in 530 to 560 nm.

Such peaks enhance not only the luminance of red pixels but also the luminance and color purity of blue and green pixels in the same element, thereby ensuring the white balance.

However the peak may be in 570 nm or more as far as the above-mentioned elements are satisfied.

According to a second aspect of the invention, there is provided a color emission device comprising: a luminescence element, that emits light having a blue component and a yellow to red component in a luminescence intensity ratio of the blue component to the yellow to red component of 9:1 to 5:5, and a blue converting member, a green converting member and a red converting member that emit blue light, green light and red light, respectively upon receiving light emitted from the luminescence element.

The luminance converting efficiency of the green converting member relative to the luminance of light emitted from the luminescence element is preferably 50% or more.

The luminance converting efficiency of the red converting member relative to the luminance of light emitted from the luminescence element is preferably 10% or more.

The red converting member preferably comprises a laminate of a fluorescence converting layer and a color filter layer along the direction of taking out light, the fluorescence converting layer absorbing a part of light emitted from the luminescence element to emit fluorescence having a longer wavelength, the color filter layer cutting off unnecessary light, and the color filter has a transmittance of 60% or less at a wavelength of 600 nm.

The green converting member preferably comprises a laminate of a fluorescence converting layer and a color filter layer along the direction of taking out light, the fluorescence converting layer absorbing a part of light emitted from the luminescence element to emit fluorescence having a longer wavelength, the color filter layer cutting off unnecessary light, and the color filter has a transmittance of 80% or more at a wavelength of 540 nm.

The luminescence element is preferably an organic electroluminescence element.

BEST MODES FOR CARRYING OUT THE INVENTION

Figure 1:
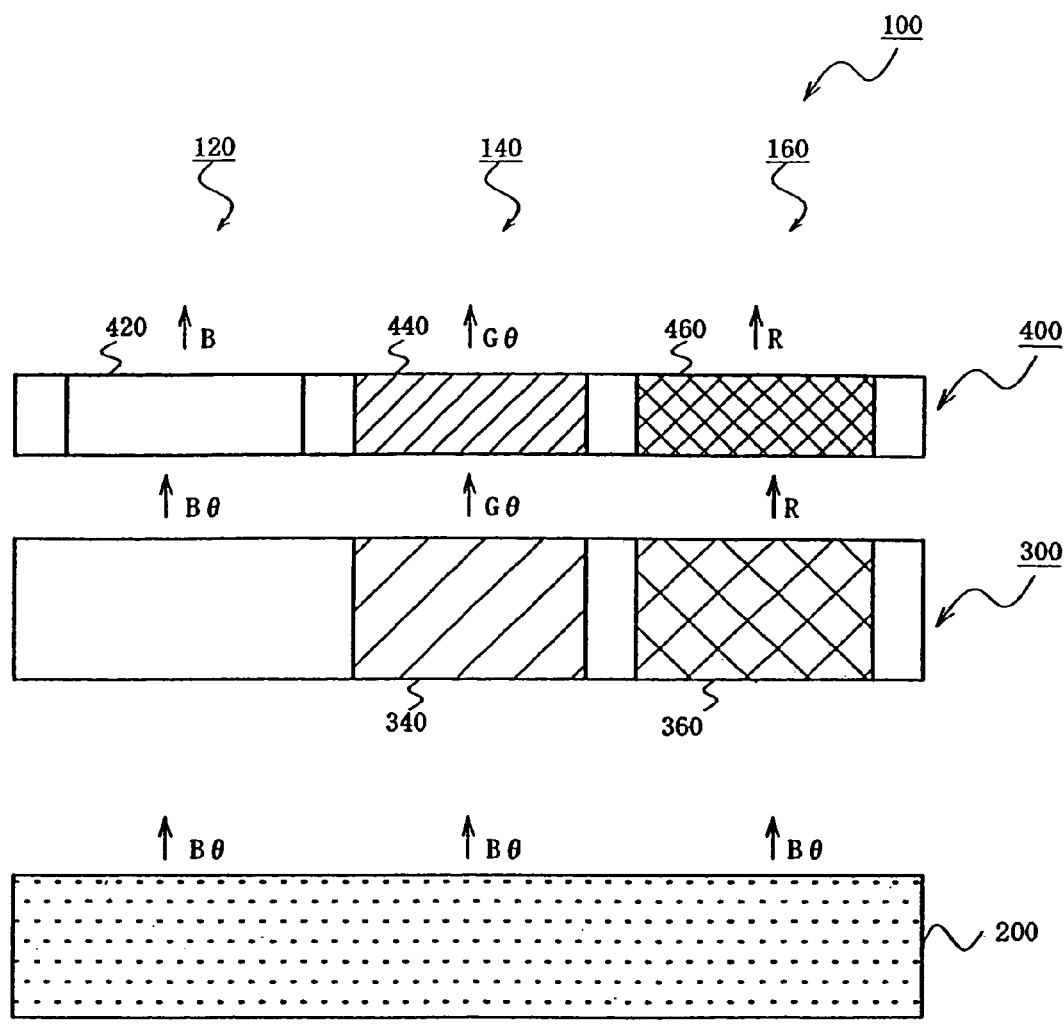
FIG. 1 is a diagram of a color emission device according to an embodiment of the invention.

The respective constituting members will be described hereinafter.

(1) Organic EL Element

In an organic EL element, besides an emitting layer, the following can be used if necessary: a hole injection layer, an electron injection layer, an organic semiconductor layer, an electron barrier layer, an adhesion improving layer, and so on.

Representative structural examples of the organic EL element are shown below.

Anode/emitting layer/cathode

Anode/hole injection layer/emitting layer/cathode

Anode/emitting layer/electron injection layer/cathode

Anode/hole injection layer/emitting layer/electron injection layer/cathode

Anode/organic semiconductor layer/emitting layer/cathode

Anode/organic semiconductor layer/electron barrier layer/emitting layer/cathode

Anode/hole injection layer/emitting layer/adhesion-improving layer/cathode (i) Anode As the anode, there is preferably used an anode using, as an electrode material, a metal, an alloy, an electrically conductive compound having a large work function (4 eV or more), or a mixture thereof. Specific examples of such an electrode material include metals such as Au, and electrically conductive transparent materials such as CuI, ITO, $SnO_2$, ZnO and IZO.

(ii) Emitting Layer

The emitting material of an organic EL element is mainly an organic compound. Specifically, dependently on a desired color tone, examples thereof are as follows.

First, in the case that luminescence of from the ultraviolet ray range to violet color is obtained, compounds represented by the following chemical formula (1) are given:

(1)

In this general formula, X represents a compound represented by the following chemical formula (2):

(2)

wherein n is 2, 3, 4 or 5, and Y represents a compound represented by the following chemical formula (3):

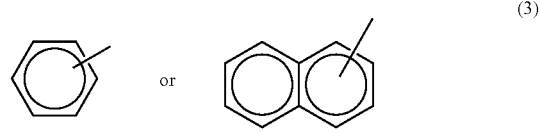

(3)

The phenyl group, the phenylene group or the naphthyl group of the above-mentioned compounds may be substituted with one or more groups out of alkyl groups having 1 to 4 carbon atoms, alkoxy groups, a hydroxyl group, a sulfonyl group, a carbonyl group, an amino group, a dimethylamino group, a diphenylamino group and so on. These may be bonded to each other to form a saturated 5-membered or 6-membered ring. Substituents bonded to the phenyl, phenylene or naphthyl group at the para-position are preferred for forming a smooth vapor-deposition film because of their high bonding ability. Specifically, compounds represented by the following chemical formulae (4) to (8) are given. In particular preferred are p-quarterphenyl derivatives and p-quinquephenyl derivatives.

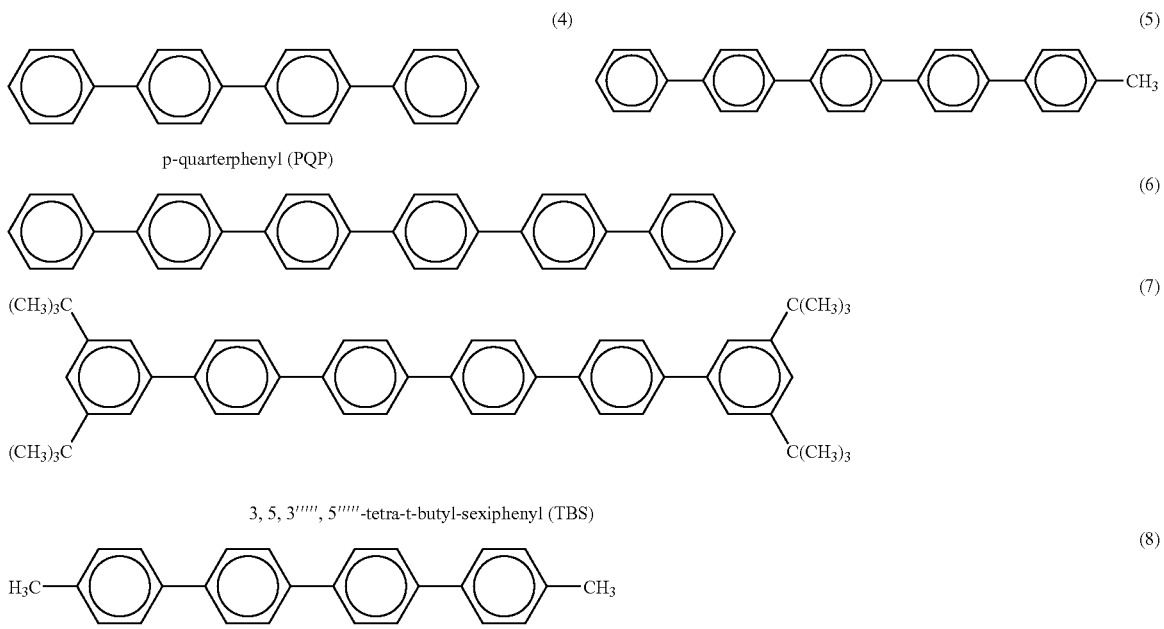

Secondly, in order to obtain luminescence of from blue color to green color, for example, the following can be given: benzothiazole-based, benzoimidazole-based, and benzoxazole-based fluorescent bleaching agents, metal-chelated oxynoid compounds, and styryl benzene-based compounds.

Specific compounds include compounds disclosed in JP-A No. 59-194393. Typical examples thereof include benzoxazole-based, benzothiazole-based, and benzoimidazole-based fluorescent bleaching agents.

Moreover, other useful compounds are listed up in Chemistry of Synthetic Dyes, 1971, pages 628 to 637 and 640.

As the chelated oxynoid compounds, for example, compounds disclosed in JP-A No. 63-295695 can be used. Typical examples thereof include 8-hydroxyquinoline-based metal complexes such as tris(8-quinolinol)aluminum (abbreviated to Alq hereinafter), and dilithium epintridione.

As the styryl benzene-based compounds, there can be used, for example, compounds disclosed in EP No. 0319881 and EP No. 0373582.

A distyrylpyrazine derivative disclosed in JP-A No. 2-252793 can also be used as the material of the emitting layer.

Besides, for example, a polyphenyl-based compound disclosed in EP No. 0387715 can also be used as the material of the emitting layer.

Besides the above-mentioned fluorescent bleaching agents, metal-chelated oxynoid compounds, and styryl benzene-based compounds, for example, the following can also be used as the material of the emitting layer:
12-phthaloperynone (J. Appl. Phys. vol. 27, L713 (1988),
1,4-diphenyl-1,3-butadiene and 1,1,4,4-tetraphenyl-1,3-butadiene (Appl. Phys. Lett. vol. 56, L799 (1990)),
naphthalimide derivatives (JP-A No. 2-305886),
perylene derivatives (JP-A No. 2-189890),
oxadiazole derivatives (JP-A No. 2-216791 or oxadiazole derivatives disclosed in 38$^{th}$, Combined Lecture Meeting related to Applied Physics by Hamada et al.),
aldazine derivatives (JP-A No. 2-220393),
pyrazoline derivatives (JP-A No. 2-220394),
cyclopentadiene derivatives (JP-A No. 2-289675),
pyrrolopyrrole derivatives (JP-A No. 2-296891),
styrylamine derivatives (Appl. Phys. Lett., vol. 56, L799 (1990)), coumarin-based compounds (JP-A No. 2-191694),
polymer compounds as described in International Publication WO90/13148, Appl. Phys. Lett. vol. 58, 18, P1982 (1991), or the like.

In the present invention, it is preferred to use an aromatic dimethylidyne-based compound (disclosed in EP No. 0388768 and JP-A No. 3-231970) as the material of the emitting layer. Specific examples thereof include:
4,4'-bis(2,2-di-t-butylphenylvinyl)biphenyl (abbreviated to DTBPBBi hereinafter),
4,4'-bis(2,2-diphenylvinyl)biphenyl (abbreviated to DPVBi hereinafter), and derivatives thereof.

Furthermore, compounds represented by a general formula $(R_s-Q)_2-Al-O-L$ described in JP-A No. 5-258862 are also given, wherein L is a hydrocarbon containing a phenyl moiety and having 6 to 24 carbon atoms, O-L is a phenolate ligand, Q represents a substituted 8-quinolinolate ligand, and $R_S$ represents an 8-quinolinolate ring substituent selected to hinder three-dimensionally the phenomenon that more than two substituted 8-quinolinolate ligands are bonded to the aluminum atom.

Specific examples thereof include:
bis(2-methyl-8-quinolinolate)(para-phenylphenolate)aluminum (III) (abbreviated to PC-7 hereinafter), and
bis(2-methyl-8-quinolinolate)(1-naphtholate)aluminum (III) (abbreviated to PC-17 hereinafter).

Besides, there can be given a method of obtaining mixed luminescence of blue and green colors, having a high efficiency, in which doping described in JP-A No. 6-9953 or the like is used. In this case, examples of a host are the above-mentioned emitting materials, and a dopant may be a fluorescent dye exhibiting intense light of from blue to green colors, examples of which include coumarin-based fluorescent dyes and the same fluorescent dyes as used as the above-mentioned host.

Specific examples of the host include emitting materials having a distyrylarylene skeleton. For example DPVBi is particularly preferred. Examples of the dopant for blue luminescence include diphenylaminovinylarylenes, particularly preferably N,N-diphenylaminovinylbenzene (DPAVB).

High molecular materials (number average molecular weight of 10000 or more) are also preferably used as well as the above-mentioned low molecular materials (number average molecular weight less than 10000).

Specific examples include polyarylenevinylenes and derivatives thereof (PPV), polyfluorenes and derivatives thereof, and copolymers containing fluorene.

The kind of an emitting layer for obtaining white luminescence is not particularly limited, and examples thereof include:

(1) a product in which energy levels of respective layers of an organic EL laminated structure are specified and light is emitted using tunnel injection (EP-A No. 0390551);
(2) a display using tunnel injection in the same manner as the (1), Example of which is a white light emitting display (JP-A No. 3-230584);
(3) a product including an emitting layer having a bi-layered structure (JP-A Nos. 2-220390 and 2-216790);
(4) a product in which an emitting layer is divided into plural layers and they are made of materials having different emitting wavelengths (JP-A No. 4-51491);
(5) a product having a structure in which a blue luminous body (fluorescence peak: 380 to 480 nm) and a green luminous body (480 to 580 nm) are laminated on each other, and a red fluorescent body is contained (JP-A No. 6-207170); and
(6) a product having a structure in which a blue luminous layer has a region containing a blue fluorescent dye and a green luminous layer has a region containing a red fluorescent dye, and further a green fluorescent body is contained (JP-A No. 7-142169).

In particular, the structure (5) is preferably used.

An Example of Dopants for Yellow Luminescence
(Rubrene)

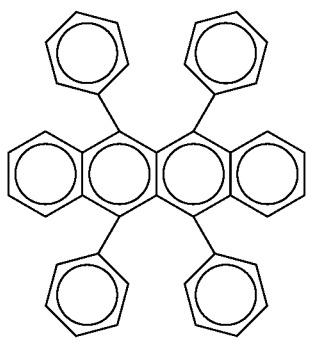

Examples of Dopants for Red or Orange Luminescence

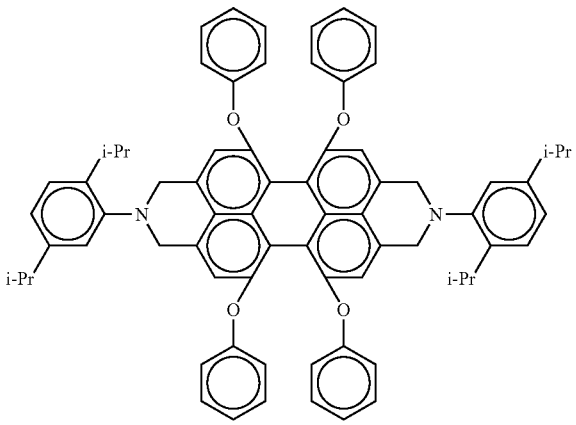

(Lumogen F Red)

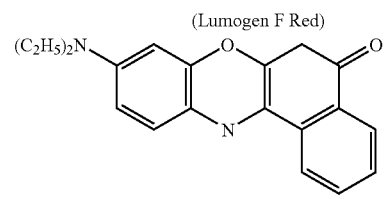

(Phenoxazone)

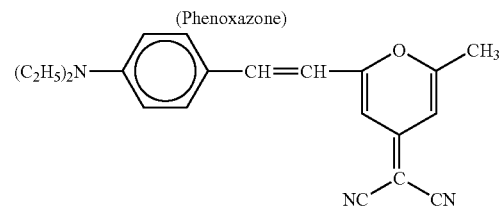

(Dicyanomethylenepyran)

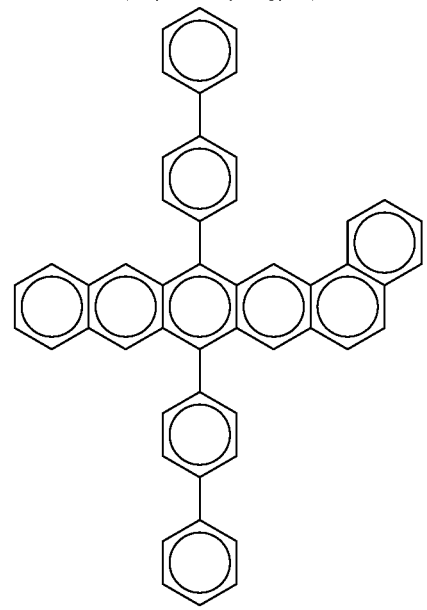

In order to obtain an emission spectrum having peaks in the blue and green ranges, or the blue range and the range of 500 to 600 nm, the above "compounds for luminescence of from the ultraviolet ray range to violet color" and the above "compounds for white luminescence" can be used in addition to the above "compounds for blue to green luminescence". Further, if necessary, the compounds used in a hole or electron injecting layer described below can also be used.

In order to adjust the peak intensities in the blue and green ranges, an emitting layer is formed by mixing a compound emitting near ultraviolet to bluish green light with a compound emitting green to red light, adjusting the ratio thereof. Alternatively an emitting layer is constructed of lamination of a layer containing a compound emitting near ultraviolet to bluish green light and a layer containing a compound emitting green to red light, adjusting the thickness thereof and/or ratio of these compounds in each layer.

(iii) Hole Injection Layer

Examples of a hole injection material constituting the hole injection layer include triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, fluorenone derivatives, hydrazone derivatives, styrylanthracene derivatives, stylbene derivatives, silazane derivatives, polysilane, aniline-based copolymers, and electrically conductive high molecular oligomers (in particular, thiophene oligomers), one of which or any combination of two or more selected from which may be used.

(iv) Electron Injection Layer

Examples of an electron injection material constituting the electron injection layer include tris(8-quinolinolate)aluminum, tris(8-quinolinolate)gallium, bis(10-benzo[h]quinolinolate)beryllium, triazole derivatives, oxadiazole derivatives, triazine derivatives, perylene derivatives, quinoline derivatives, quinoxaline derivatives, diphenylquinone derivatives, nitro-substituted fluorenone derivatives, and thiopyran dioxide derivatives, one of which or any combination of two or more selected from which may be used.

It is also preferred to add, to such an electron injection material, an alkali metal, an alkaline earth metal, a rare earth metal, an alkali compound, an alkaline earth compound, a rare earth compound, or an alkali metal to which an organic compound is coordinated, as a dopant.

(v) Cathode

As the cathode, there is preferably used a cathode using, as an electrode material, a metal, an alloy, an electrically conductive compound having a small work function (4 eV or less), or a mixture thereof. Specific examples of such an electrode material include sodium, sodium-potassium alloy, magnesium, lithium, magnesium-silver alloy, aluminum/ aluminum oxide ($Al_2O_3$), aluminum-lithium alloy, indium, and rare earth metals, one of which or any combination of two or more selected from which may be used.

(2) Color Converting Member

As the color converting member, for example, a fluorescent dye and a binder resin, or only a fluorescent dye can be used.

Examples of the fluorescent dye for converting luminescence of from the near ultraviolet ray range to violet from the organic EL element to blue luminescence include stylbene-based dyes such as 1,4-bis(2-methylstyryl)benzene (abbreviated to Bis-MSB hereinafter) and trans-4,4'-diphenylstylbene (abbreviated to DPS hereinafter), and coumarin-based dyes such as 7-hydroxy-4-methylcoumarin (referred to as Coumarin 4 hereinafter), one of which or any combination of two or more selected from which may be used.

Examples of the fluorescent dye for converting luminescence of from blue to bluish green from the organic EL element to green luminescence include coumarin dyes such as 2,3,5,6-1H,4H-tetrahydro-8-trifluoromethylquinolidino (9,9a,1-gh) coumarin (referred to as. Coumarin 153 hereinafter), 3-(2'-benzothiazolyl)-7-diethylaminocoumarin (referred to as Coumarin 6 hereinafter), 3-(2'-benzimidazolyl)-7-N,N-diethylaminocoumarin (referred to as Coumarin 7 hereinafter), and naphthalimide dyes such as Basic Yellow 51, Solvent yellow 11 and Solvent Yellow 116, one of which or any combination of two or more selected from which may be used.

Examples of the fluorescent dye for converting luminescence of from blue to green from the organic EL element to luminescence of from orange to red include cyanine-based dyes such as 4-dicyanomethylene-2-methyl-6-(p-dimethylaminostyryl)-4H-pyran (abbreviated to DCM hereinafter), pyridine-based dyes such as 1-ethyl-2-(4-(p-dimethylaminophenyl)-1,3-butadienyl)-pyridinium-perchlorate (referred to as pyridine 1 hereinafter), and rhodamine-based dyes such as Rhodamine B, Rhodamine 6G and Basic Violet 11, and oxazine-based dyes, one of which or any combination of two or more selected from which may be used.

As a fluorescent dye used in a green converting member, the above-mentioned fluorescent dyes converting near ultraviolet to violet light emitted from an organic EL element to blue light and fluorescent dyes converting blue to bluish green light emitted from an organic EL element to green light can be used either individually or in mixture dependently on the color of light emitted from the organic EL element.

As a fluorescent dye used in a red converting member, the above-mentioned fluorescent dyes converting near ultraviolet to violet light emitted from an organic EL element to blue light, fluorescent dyes converting blue to bluish green light emitted from an organic EL element to green light, and fluorescent dyes converting blue to green light emitted from an organic EL element to orange to red light can be used either individually or in mixture dependently on the color of light emitted from the organic EL element.

Various dyes (such as direct dyes, acid dyes, basic dyes, and disperse dyes) may be used if they have fluorescence.

There may be used pigments in which a fluorescent dye is beforehand kneaded into a pigment resin such as polymethacrylic acid esters, polyvinyl chlorides, vinyl chloride/ vinyl acetate copolymers, alkyd resins, aromatic sulfonamide resins, urea resins, melamine resins, benzoguanamine resins or the like.

As a binder resin, a transparent material (having a transmittance of 50% or more within the range of visible rays) is preferably used. Examples thereof are transparent resins (polymers) such as polymethyl methacrylates, polyacrylates, polycarbonates, polyvinyl alcohols, polyvinyl pyrrolidones, hydroxyethylcelluloses, and carboxymethylcelluloses, one of which or any combination of two or more selected from which may be used.

In the case that the color converting member is two-dimensionally separated and arranged, it is preferred to use a photosensitive resin to which photolithography can be applied. Examples thereof include photocuring resist materials having a reactive vinyl group, such as acrylic acid-, methacrylic acid-, polyvinyl cinnamate-, and cyclic rubber-type reactive vinyl groups. In the case of using a printing or ink-jet method, printing ink (medium) using a transparent resin can be used. Examples of the transparent resin include transparent resins such as monomers, oligomers and polymers of polyamides, polyvinyl chloride resins, melamine resins, phenol resins, alkyd resins, epoxy resins, polyurethane resins, polyester resins, maleic acid resins, polymethyl methacrylates, polyacrylates, polycarbonates, polyvinyl alcohols, polyvinyl pyrrolidones, hydroxyethylcelluloses, and carboxymethylcelluloses.

Here in order that the excitation spectrum of red converting member can have a peak in the blue range, it is preferred to select a fluorescent dye that converts near ultraviolet to bluish green light emitted from an organic EL element to blue to red light.

That is, fluorescent dyes with an absorption peak in 400 to 500 nm are preferably selected.

In order that the excitation spectrum of red converting member can have a peak in the range other than the blue range, it is preferred to select a fluorescent dye that converts blue to orange light emitted from an organic EL element to orange to red light.

That is, fluorescent dyes with an absorption peak in 500 to 600 nm are preferably selected.

(3) Color Filter

Examples of the color filter material include the following dyes, and solid substance in which any one thereof is dissolved or dispersed in a binder resin.

(i) Red (R) Dyes:

Perylene-based pigments, lake pigments, azo-based pigments, quinacridone-based pigments, anthraquinone-based pigments, anthracene-based pigments, isoindoline-based pigments, isoindolinone-based pigments, DPP pigments (diketopyrrolopyrrole pigments) and mixtures thereof.

(ii) Green (G) Dyes:

Halogen-multisubstituted phthalocyanine-based pigments, halogen-multisubstituted copper phthalocyanine-based pigments, triphenylmethane-based basic dyes, isoindoline-based pigments, isoindolinone-based pigments, and mixtures thereof.

(iii) Blue (B) Dyes:

Copper phthalocyanine-based pigments, indanthrone-based pigments, indophenol-based pigments, cyanine-based pigments, dioxazine-based pigments, and mixtures thereof.

As the binder resin, the above-mentioned materials can be used.

In the case that the color filter is two-dimensionally separated and arranged, it is preferred to use the above-mentioned photosensitive resins to which photolithography can be applied. In the case of using a printing or ink-jet method, the above-mentioned printing ink (medium) using a transparent resin can be used.

Among the above color filters, it is preferred that perylene pigments, anthraquinone pigments, DPP pigments and azo-based pigments and isoindolinone pigments are properly mixed and used as a red dye. Accordingly there can be obtained a color emission device with a high purity of red light that has a high transmittance in the red range (wavelength of 600 nm or more) and low transmittances in the blue range (400 to 500 nm) and green range (500 to 600 nm).

FIRST EMBODIMENT

Referring to the drawings, an embodiment of the invention will be described.

FIG. 1 is a diagram of a color emission device according to an embodiment of the invention. In this figure, numeral 100 denotes a color emission device, 200 an organic EL element emitting light containing a component with a peak in the blue range (blue component) (B) and a component (θ) with a peak in the range other than blue range, for example 500 to 600 nm, 300 a color converting member containing a fluorescent dye, and 400 a color filter. Numeral 120 denotes a blue pixel, 140 a green pixel, and 160 a red pixel.

The color converting member 300 contains a green converting member 340 and a red converting member 360. When the green converting member 340 receives light emitted from the organic EL element, it absorbs a blue component (emitting component having a wavelength of 400 to 500 nm) to emit fluorescence of green component (500 to 600 nm). When the red converting member 360 receives light emitted from the organic EL element, it absorbs a blue to green component to emit fluorescence of red component (600 nm or more).

The excitation spectrum of the red converting member 360 has a peak in 500 to 600 nm. However it may has a peak in 400 to 500 nm.

The color filter 400 contains a blue filter 420 that mainly transmits a blue component, a green filter 440 that mainly transmits a green component and a red filter 460 that mainly transmits a red component.

The blue pixel 120 contains the blue filter 420. The green pixel 140 contains the green converting member 340 and the green filter 440. The red pixel 160 contains the red converting member 360 and the red filter 460.

Next the action of the color emission device will be described.

The organic EL element 200 emits light containing a blue component and a component (θ) having a peak in 500 to 600 nm. The component θ mainly corresponds to a green component.

Figure 4:
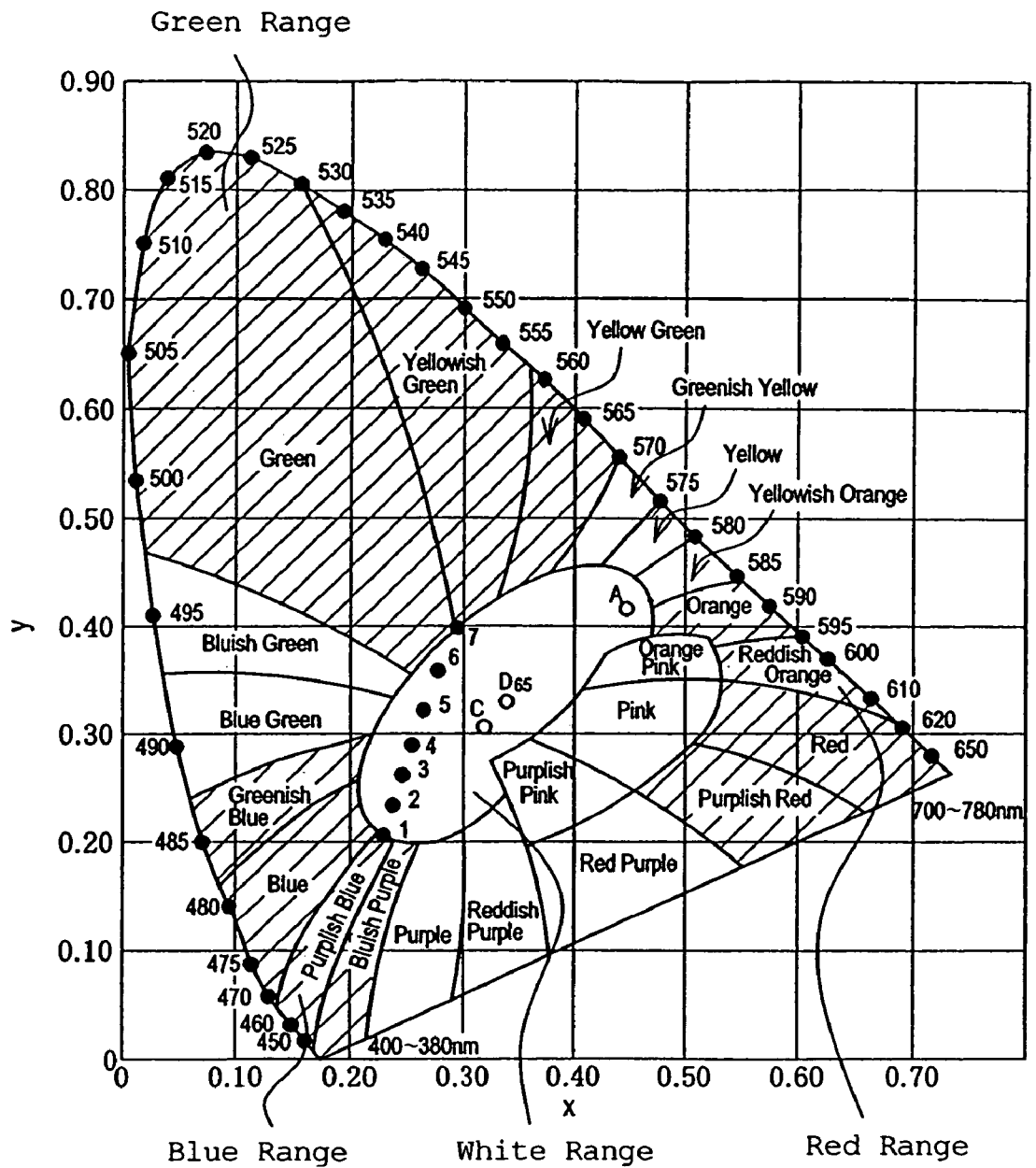
FIG. 4 is a CIE chromaticity diagram showing the simulation results.

In the blue pixel, the color converting member 300 transmits the light as it is but the blue filter 420 cuts off the most of the component θ. Thus blue light is emitted from the blue filter 420. However the component θ is not cut off completely by the blue filter in some cases but there is no problem if the chromaticity in the range of bluish purple to greenish blue can be obtained as blue in the chromaticity diagram (FIG. 4).

In the green pixel, the green converting member 340 absorbs a blue component to emit fluorescence of green component. The member 340 transmits the component θ as it is. The green filter 440 transmits the green component of component θ and the green fluorescence converted from the blue component, since the component θ mainly corresponds to a green component. Thus green light is emitted from the green filter 440.

In the red pixel, the red converting member 360 absorbs a blue to green component to emit fluorescence of red component. At this time, the component θ excites the red converting member 360 to increase the intensity of red fluorescence because the excitation spectrum of red converting member 360 has a peak in 500 to 600 nm. Next the red filter 460 cuts off the component θ. Thus red light intensified is emitted from the red filter 460.

In some cases, the green converting member 340 and red converting member 360 transmit the blue component (B) or the component θ emitted from the organic EL element. However, the most thereof is cut off by the green filter or red filter. Even in the case where they are not cut off completely by the green or red filter, there is no problem if the chromaticity in the range of green to yellow green as green, and the chromaticity in the range of orange to purplish red as red can be obtained in the chromaticity diagram (FIG. 4).

The color emission devices are classified into top emission type and -bottom emission type. In a color emission device of bottom emission type, a substrate (not shown), a color filter 400, a color converting member 300 and an organic EL element 200 are laminated in this order and light is taken out from the substrate side. In a color emission device of top emission type, a substrate, an organic EL element 200, a color converting member 300 and a color filter 400 are laminated in this order and light is taken out from the opposite side to the substrate.

In this embodiment, an organic EL element is represented as one member common to each pixel but the organic EL element may be separately formed per pixel.

EMBODIMENT 2

SIMULATION

Furthermore, white balance (balance between luminescence intensities of red, green and blue colors in the case of white display) of an organic EL element with an emission spectrum having peaks in the blue range and 500 to 600 nm range in the color emission device shown in FIG. 1 was obtained by simulation.

(Simulation Method)

The simulation method herein is a method for obtaining emission spectra taken out from the color filter in the color emission device shown in FIG. 1 without actual measurement, which method is found by the inventors. Details thereof are described in Japanese Patent Application No. 2000-360187.

According to the method, the emission spectrum $WL(\lambda)$ f light taken out from a color filter can be obtained from the following equation:

$$WL(\lambda) = \{w(\lambda) \cdot 10^{-Abs(\lambda)} + lu(\lambda) \cdot F/F_0\} \cdot T_{CF}(\lambda)$$

$$F/F_0 = \{\int \lambda w(\lambda) \cdot EX(\lambda) d\lambda\} / \{\int \lambda el(\lambda) \cdot EX(\lambda) d\lambda\}$$

wherein $F_0$ represents the number of effective photons which contribute to light emission of a color converting member in the case of using a standard light source as an organic EL element, F represents the number of effective photons which contribute to light emission of the color converting member in the case of using a light source other than the standard light source as the organic EL element, $\lambda$ represents wavelength, $W(\lambda)$ represents the normalized emission spectrum of a light source other than the standard light source, $Abs(\lambda)$ represents the absorption spectrum of the color converting member, $lu(\lambda)$ represents the normalized spectrum obtained by normalizing, with the emission spectrum of the standard light source, a net emission spectrum from the color converting member in the case of using the standard light source, $EX(\lambda)$ represents the excitation spectrum of the color converting member, $el(\lambda)$ represents the spectrum obtained by normalizing the emission spectrum of the standard light source, and $T_{CF}(\lambda)$ represents the transmittance spectrum of the color filter.

Furthermore, the luminance L of the color emission device can be obtained from the following equation:

$$L = L_0 \cdot \eta$$

$$\eta = \{\int WL(\lambda) \cdot y(\lambda) d\lambda\} / \{\int el(\lambda) \cdot y(\lambda) d\lambda\}$$

wherein $\eta$ represents a luminance conversion efficiency, $L_0$ represents the luminance of the standard light source, and $y(\lambda)$ represents $y^-(\lambda)$ of the color matching function in the XYZ color coordinate system of CIE1931.

Furthermore, the CIE chromaticity coordinate (X, Y) of the color emission device can be obtained from the following equation:

$$X = \{\int WL(\lambda) \cdot x(\lambda) d\lambda\} / \{\int WL(\lambda) \cdot x(\lambda) d\lambda + \int WL(\lambda) \cdot y(\lambda) d\lambda + \int WL(\lambda) \cdot z(\lambda) d\lambda\}$$

$$Y = \{\int WL(\lambda) \cdot y(\lambda) d\lambda\} / \{\int WL(\lambda) \cdot x(\lambda) d\lambda + \int WL(\lambda) \cdot y(\lambda) d\lambda + \int WL(\lambda) \cdot z(\lambda) d\lambda\}$$

wherein $x(\lambda)$ and $z(\lambda)$ represent $x^-(\lambda)$ and $z^-(\lambda)$ of the color matching functions in the XYZ color coordinate system of CIE1931, respectively.

Furthermore, in the color emission device, the CIE chromaticity coordinate (Xh, Yh) of a white point based on combination of pixels in the three primary colors can be obtained from an equation described below.

First, from the above-mentioned equation, luminances $L_R$, $L_G$ and $L_B$ are calculated, and further chromaticity coordinates $(R_x, R_y)$, $(G_x, G_y)$ and $(B_x, B_y)$ are obtained. From the following equation, these luminances and chromaticity coordinates are used to calculate the chromaticity coordinate (Xh, Yh) of the white point.

$$Xh = \{L_R \cdot R_x/R_y + L_G \cdot G_x/G_y + L_B \cdot B_x/B_y\} / \{L_R/R_y + L_G/G_y + L_B/B_y\}$$

$$Yh = \{L_R + L_G + L_B\} / \{L_R/R_y + L_G/G_y + L_B/B_y\}$$

(Simulation Results)

An organic EL element with an emission spectrum having peaks in the blue range and the range of 500 to 600 nm was assumed. The white balance (balance between luminescence intensities of red, green and blue colors in the case of white display) of samples 1 to 7 was obtained by simulation. In the samples 1 to 7, the peak intensity ratio of the blue component to the 500-600 nm component was varied from 10:0 to 4:6 in the emission spectrum.

Figure 2:
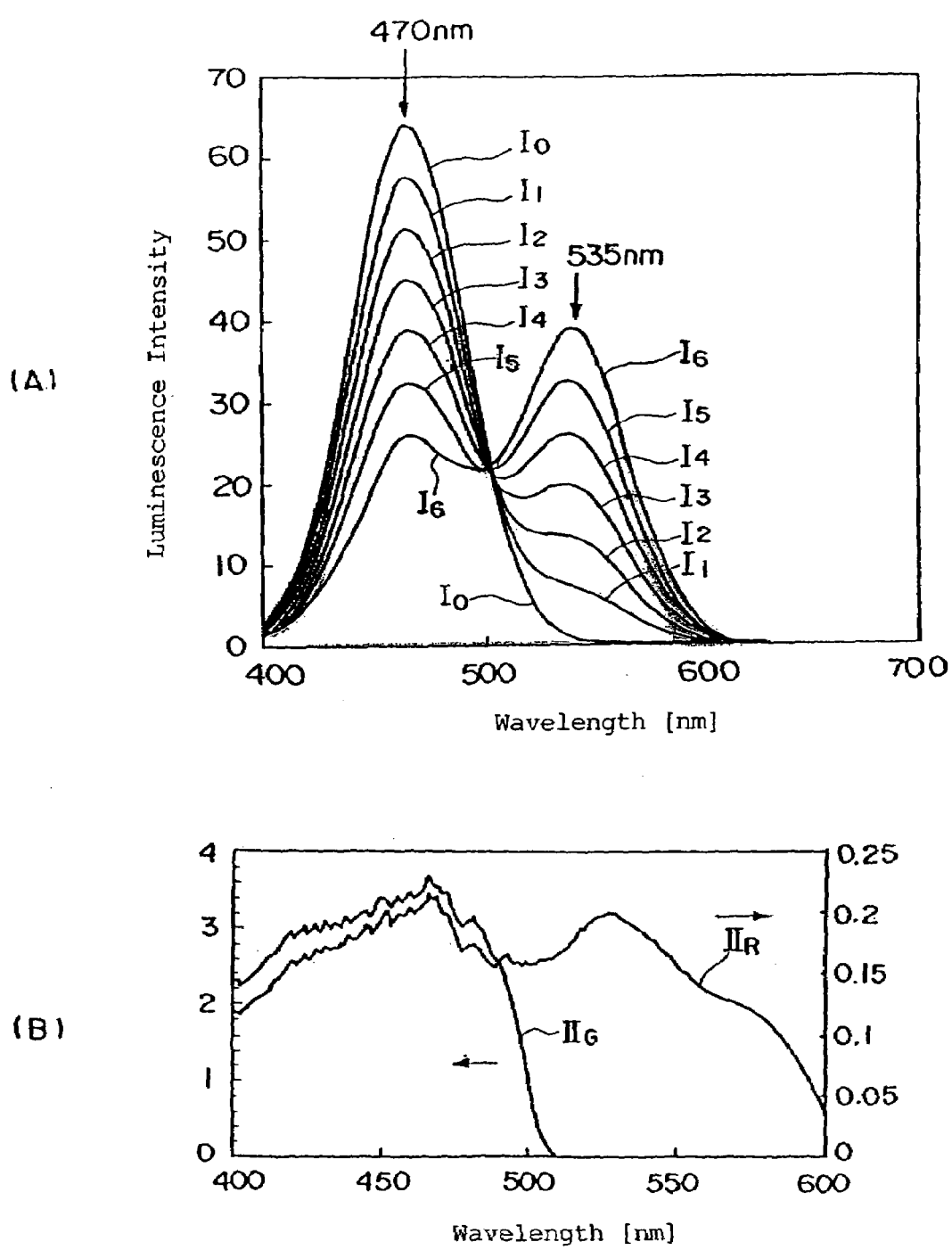
FIG. 2(A) shows the emission spectra of organic EL element samples Nos. 1 to 7 used for simulation
FIG. 2(B) shows excitation spectra of green and red converting members used for simulation.

First FIG. 2(A) shows the emission spectra of the organic EL element samples 1 to 7 as curves $I_0$ to $I_6$.

These curves $I_0$ to $I_6$ show emission spectra when the peak intensity ratio of the blue component to the 500-600 nm component is 10:0, 9:1, 8:2, 7:3, 6:4, 5:5 and 4:6, respectively. Only the emission spectrum of curve $I_0$ has a single peak in the blue range. The other emission spectra of curves $I_1$ to $I_6$ have peaks in the blue range and the range of 500 to 600 nm.

FIG. 2(A) shows an emission spectrum of Gaussian distribution under conditions that the peak wavelength of the blue component is 470 nm, that of the 500-600 nm component is 535 nm, and the half band widths thereof are 60 nm.

FIG. 2(B) shows excitation spectra of green and red converting members used for simulation. The excitation spectra were obtained as follows: Each converting member was scanned in the range of wavelength 380 nm to 600 nm by a spectrometer to obtain the spectrum intensity $I(\lambda)$. The emission spectrum is obtained by dividing this intensity I(λ) by the luminescence spectrum intensity L(λ) of the light source of the spectrometer.

In the graph of FIG. 2(B), the left vertical axis represents the excitation intensity of a green converting member (arbi- Table 1 shows CIE chromaticity coordinates and so on in the case that white color is displayed in color emission devices using the samples 1 to 7 as an organic EL element, which results are obtained by the above-mentioned simulation method.

TABLE 1

| No | B | G | ηR | R-x | R-y | ηG | G-x | G-y | ηB | B-x | B-y | ηW | W-x | W-y |
|----|----|----|-------|-------|-------|--------|-------|-------|-------|-------|-------|-------|-------|-------|
| 1 | 1 | 0 | 51.3% | 0.644 | 0.345 | 124.5% | 0.228 | 0.689 | 31.5% | 0.141 | 0.046 | 69.1% | 0.231 | 0.205 |
| 2 | 0.9 | 0.1 | 33.9% | 0.644 | 0.347 | 94.8% | 0.239 | 0.691 | 18.7% | 0.141 | 0.047 | 49.2% | 0.240 | 0.234 |
| 3 | 0.8 | 0.2 | 25.7% | 0.643 | 0.349 | 80.7% | 0.247 | 0.692 | 12.7% | 0.141 | 0.048 | 39.7% | 0.250 | 0.264 |
| 4 | 0.7 | 0.3 | 20.9% | 0.642 | 0.351 | 72.4% | 0.253 | 0.693 | 9.1% | 0.141 | 0.050 | 34.1% | 0.261 | 0.296 |
| 5 | 0.6 | 0.4 | 17.7% | 0.641 | 0.352 | 67.0% | 0.258 | 0.694 | 6.8% | 0.140 | 0.052 | 30.5% | 0.272 | 0.330 |
| 6 | 0.5 | 0.5 | 15.5% | 0.641 | 0.354 | 63.2% | 0.262 | 0.694 | 5.1% | 0.140 | 0.055 | 27.9% | 0.285 | 0.367 |
| 7 | 0.4 | 0.6 | 13.8% | 0.640 | 0.355 | 60.4% | 0.265 | 0.695 | 3.9% | 0.140 | 0.059 | 26.0% | 0.298 | 0.407 | trary unit), the right vertical axis represents the excitation intensity of a red converting member (arbitrary unit), and the horizontal axis represents wavelength (nm). The curve $II_R$ shows the excitation spectrum of a red converting member, while the curve $II_G$ shows the excitation spectrum of a green converting member.

As shown in the curve $II_R$, the excitation spectrum of a red converting member has peaks of excitation intensity around 470 nm and 535 nm. That is, the peak wavelength of emission spectrum of an organic EL element substantially coincides with that of excitation spectrum of a red converting member.

If the peak wavelengths of emission and excitation spectra substantially coincide with each other as mentioned above, the ratio of effective photons that contribute emission of the red converting member increases. As the ratio of effective photon number increases, the luminescence intensity of the red converting member becomes higher, because the emission spectrum of a color converting member depends on the number of effective photons that contribute the emission of the color converting member.

Figure 3:
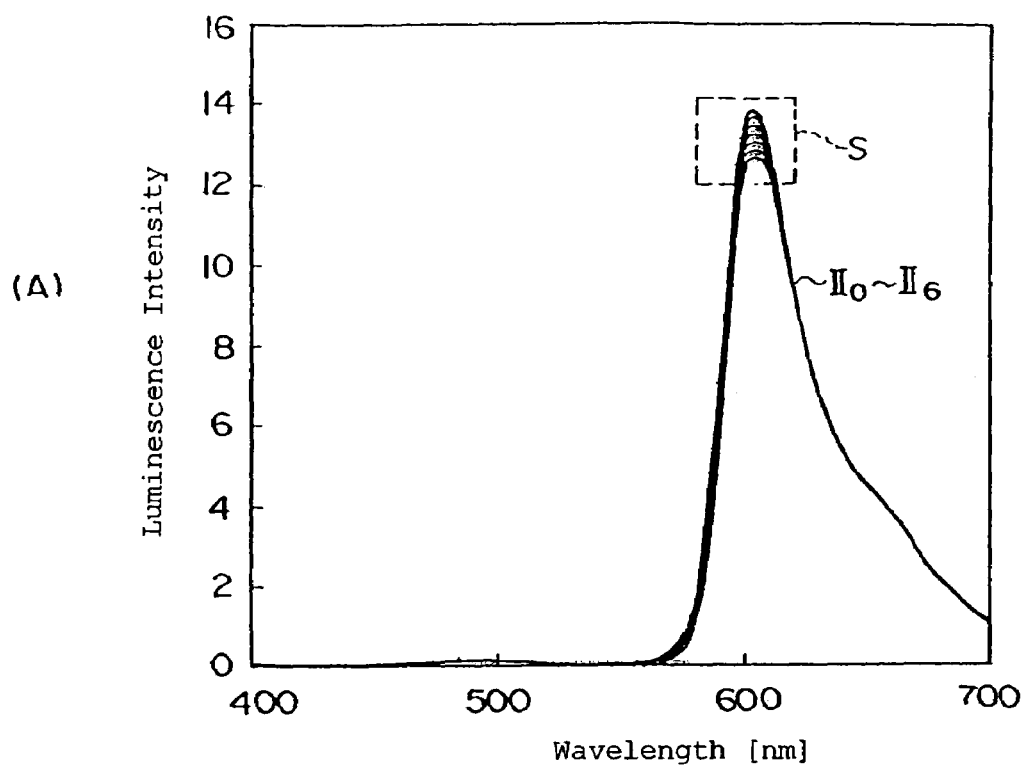
FIGS. 3(A) and (B) show the simulation results of red light luminance of red pixel.
Figure 3:
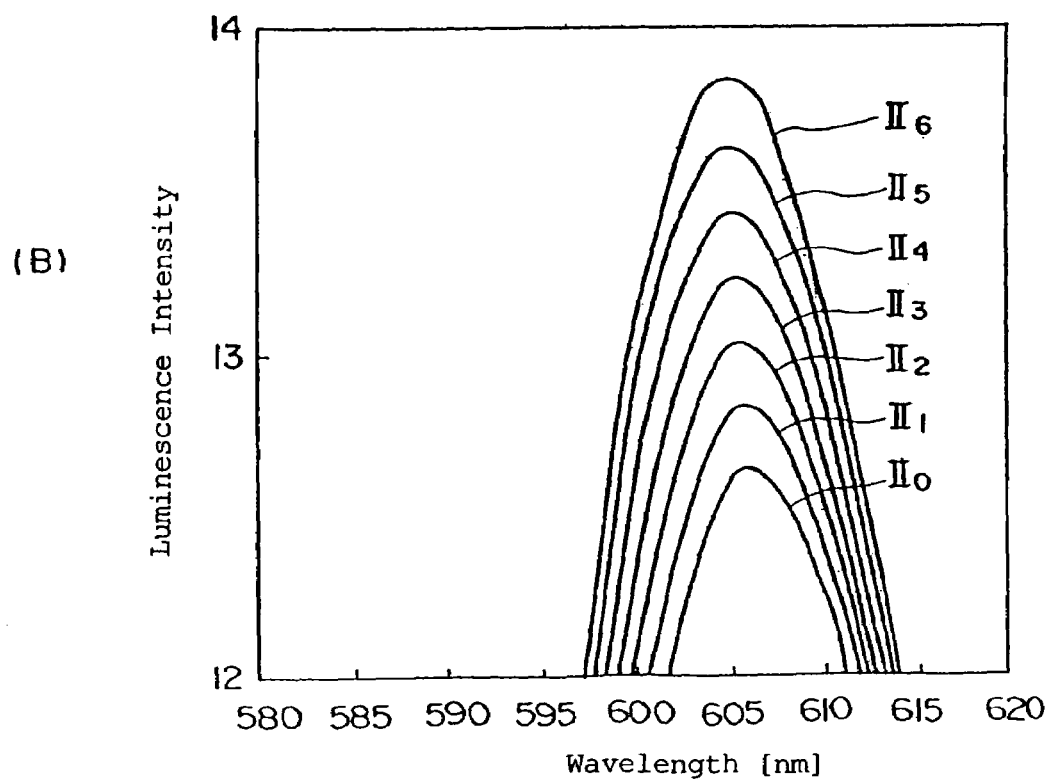

FIG. 3 shows the simulation results of luminescence intensity of red pixel.

In FIG. 3(A), the vertical axis represents wavelength (nm) and the horizontal axis represents luminescence intensity. In FIG. 3(A), the curves $II_0$ to $II_6$ show the emission spectra of red pixels using the samples 1 to 7.

FIG. 3(B) shows an enlarged part "S" of FIG. 3(A). As shown by the curves $II_0$ to $II_6$ of FIG. 3(B), the luminescence intensity (luminance) increases as the number of sample increases. That is, as shown in FIG. 2(A), the luminescence intensity increases with increase in the peak intensity ratio of the 500-600 nm component to the blue component. Specifically when the peak intensity ratio is 10:0, the luminescence intensity is the lowest. As the ratio change from 9:1 to 8:2, 7:3, 6:4, 5:5 and 4:6, the luminescence intensity increases.

It appears that the reason for the phenomenon is as follows: The peak intensity of the 500-600 nm component increases so that the waveform of the emission spectrum of an organic EL element becomes more similar to that of excitation spectrum of a red converting member. As a result, the number of effective photons contributing the emission of the red converting member increases.

If the luminescence intensity of red pixel is enhanced to be close to those of the other pixels, an excellent white balance can be obtained.

In Table 1, sample number (No.) is shown in the left end column and peak intensities of the blue component (B) and 500-600 nm component (G) are sequentially shown on the right side thereof. The X and Y values of CIE chromaticity coordinate are shown in the right end columns, "W-x" and "W-y", respectively.

Here these results are shown in FIG. 4 (chromaticity diagram).

As shown in FIG. 4, the closer to the peak intensity of the blue component the peak intensity of the 500-600 nm component is, the closer to the good white point (C light source in FIG. 4 or $D_{65}$ light source) the coordinate values of CIE chromaticity coordinate become, resulting in improvement in white balance.

EMBODIMENT 3

Figure 5:
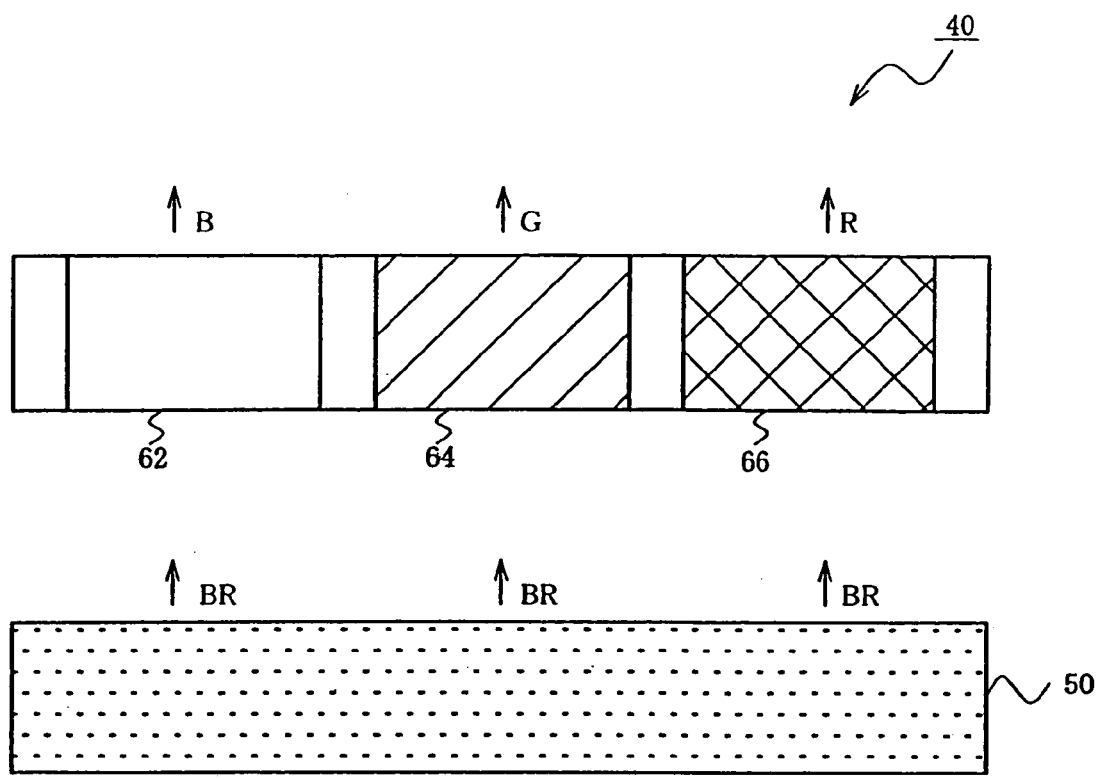
FIG. 5 is a diagram showing a color emission device according to another embodiment of the invention.

FIG. 5 is a diagram showing a color emission device according to another embodiment of the invention. In this figure, numeral 40 denotes a color emission device, 50 a luminescence element, 62 a blue converting member, 64 a green converting member, 66 a red converting member.

The luminescence element 50 emits a blue component and a yellow to red component at a certain peak intensity ratio.

The blue converting member 62 receives light from the luminescence element 50 and emits light of blue component. The green converting member 64 receives light from the luminescence element 50 and emits light of green component. The red converting member 66 receives light from the luminescence element 50 and emits light of red component.

Each color converting member is constructed of a fluorescent dye that absorbs a certain part of light emitted from the luminescence element 50 to emit the other fluorescence, a color filter that cuts off light of a certain color and improves the color purity of each color and so on.

The luminescence element is not limited so far as it can emit a blue component and a yellow to red component at a certain peak ratio.

The blue component is preferably a component having a spectrum with a peak wavelength of 430 to 480 nm, more preferably 440 to 460 nm, and a half band width of 20 to 60 nm.

Specifically the yellow to red component has color obtained by combining at least one kind of yellow, yellowish orange, orange, reddish orange and red.

It preferably has a spectrum with a peak wavelength of 540 to 610 nm, more preferably 560 to 590 nm, and a half band width of 40 to 100 nm.

In order that a color emission device emits white light with the same luminance, the luminescence intensity required for a luminescence element containing both the blue and yellow to red components may be weak compared with a color emission device using an element containing only the blue component. Thus the amount of light that a color converting member absorbs is reduced so that the degradation of the member can be suppressed and the half life of luminance as a color emission device can be longer.

The ratio of the peak intensity of blue component to that of yellow to red component is 9:1 to 5:5, preferably 8:2 to 6:4.

If the intensity ratio of red component is less than 9:1, the burden of a red converting member becomes larger to adjust the color balance of a color emission device, since the amount of the red component contained in a luminescence element is small. Consequently the durability of color emission device becomes shorter. If the intensity ratio of red component is larger than 5:5, red color becomes strong and then the color balance of color emission device may be lost.

Here the luminescence intensity is a peak strength value of radiance spectrum.

As such a luminescence element, there are exemplified an inorganic EL element, a light emitting diode (LED), an organic EL element and plasma luminescence element, preferably an organic EL element.

An example of using an organic EL element as a luminescence element will be described below.

In order that the luminescence intensity ratio of the blue component to the yellow to red component is 9:1 to 5:5, the following structure is preferred. An emitting layer is divided to plural layers. At least one layer among them functions as a blue emitting layer doped with at least one material including a blue emitting material. At least one layer other than the above layer functions as a yellow to red emitting layer doped with at least one material including either of a yellow emitting material or a red emitting material.

The structures shown below are exemplified as a specific structure of an organic EL element in the embodiments.

(i) Anode/hole injection layer/blue emitting layer doped with a blue emitting material/yellow emitting layer doped with a yellow emitting material /electron injection layer/cathode (ii) Anode/hole injection layer/yellow emitting layer doped with a yellow emitting material/blue emitting layer doped with a blue emitting material /electron injection layer/cathode (iii) Anode/hole injection layer/blue emitting layer doped with a blue emitting material/yellow emitting layer doped with yellow and bleu emitting materials/electron injection layer/cathode (iv) Anode/hole injection layer/yellow emitting layer doped with yellow and blue emitting materials/blue emitting layer doped with a blue emitting material/electron injection layer/cathode (v) Anode/hole injection layer/blue emitting layer doped with a blue emitting material/red emitting layer doped with a red emitting material/electron injection layer/cathode (vi) Anode/hole injection layer/red emitting layer doped with red a emitting material/blue emitting layer doped with a blue emitting material/electron injection layer/cathode (vii) Anode/hole injection layer/blue emitting layer doped with a blue emitting material/yellow to red emitting layer doped with a yellow to red emitting material/electron injection layer/cathode (viii) Anode/hole injection layer/yellow to red emitting layer doped with a yellow to red emitting material/blue emitting layer doped with a blue emitting material/electron injection layer/cathode (ix) Anode/hole injection layer/blue emitting layer doped with a blue emitting material/yellow to red emitting layer doped with a yellow to red emitting material/electron injection layer/cathode (x) Anode/hole injection layer/yellow to red emitting layer doped with blue and yellow to red emitting materials/blue emitting layer doped with a blue emitting material /electron injection layer/cathode A green emitting layer may further be provided to slightly adjust the spectrum form (half band width) of blue emitting component.

(xi) Anode/hole injection layer/blue emitting layer doped with a blue emitting material/green emitting layer doped with a green emitting material/yellow to red emitting layer doped with a yellow to red emitting material/ electron injection layer/cathode (xii) Anode/hole injection layer/blue emitting layer doped with a blue emitting material/yellow to red emitting layer doped with a yellow to red emitting material/green emitting layer doped with a green emitting material/electron injection layer/cathode (xiii) Anode/hole injection layer/green emitting layer doped with a green emitting material/blue emitting layer doped with a blue emitting material /yellow to red emitting layer doped with a yellow to red emitting material/electron injection layer /cathode (xiv) Anode/hole injection layer/green emitting layer doped with a green emitting material/yellow to red emitting layer doped with a yellow to red emitting material/blue emitting layer doped with a blue emitting material/electron injection layer/cathode (xv) Anode/hole injection layer/yellow to red emitting layer doped with a yellow to red emitting material/blue emitting layer doped with a blue emitting material/green emitting layer doped with a green emitting material/electron injection layer /cathode (xvi) Anode/hole injection layer/yellow to red emitting layer doped with a yellow to red emitting material/green emitting layer doped with a green emitting material/blue emitting layer doped with a blue emitting material/electron injection layer /cathode An organic EL element thus constructed can have a high efficiency and long durability at the same voltage applied, compared with a blue (or bluish green) organic EL element.

Each constituent member will be described below.

As an anode, the above-mentioned materials can be exemplified.

A blue emitting layer preferably contains a blue emitting material and is doped with at least one material.

As the blue emitting material, the following can be used: the above-mentioned benzothiazole-based, benzoimidazole-based, and benzoxazole-based fluorescent bleaching agents, metal-chelated oxynoid compounds, and styryl benzene-based compounds.

A yellow to red emitting layer is preferably doped with at least one material selected from yellow and red emitting materials.

There are exemplified dicyanomethylenepyrane derivatives, dicyanomethylenethiopyrane derivatives, fluoroscein derivatives and perylene derivatives, which are known as a red oscillating laser dye described in EP-A 0281381.

Specifically the above-mentioned dopants for yellow and red and orange luminescence are exemplified.

In order that the luminescence intensity ratio of the blue component to the yellow to red component is 9:1 to 5:5, the following methods are specifically exemplified.
(i) The content of doping material is changed in blue and yellow to red emitting layers.
(ii) The doping position in a host material is changed in blue and yellow to red emitting layers.
(iii) The thickness and complex refractive index of members constituting an element such as a cathode, organic layers, anode layer and supporting substrate are adjusted.
(iv) A dielectric layer or conductive layer is further interposed between a cathode, organic layers, anode layer and supporting substrate.
(v) An anode material or cathode material is changed.

As a hole injection/transport material constituting a hole injection/transport layer, and an electron injection/transport material constituting an electron injection/transport layer, compounds similar to the above-mentioned compounds are exemplified.

As a material for cathode, compounds similar to the above-mentioned compounds are exemplified.

There is no limitation to a method for forming each of the organic layers including an emitting layer and inorganic compound layers. For example, any known methods such as depositing, spin coating, casting and LB methods can be used.

Next a color converting member will be described.

The color converting member may be a member constructed as follows:
(i) A member made of only a fluorescent dye that absorbs light of a certain wavelength and emits light of a longer wavelength.
(ii) A member (color filter) made of a pigment dye for cutting off unnecessary light.
(iii) A member where a fluorescent dye is dispersed in a binder resin.
(iv) A member where a pigment dye for cutting off unnecessary light is dispersed in a binder resin.
(v) A member where a fluorescent dye and a color filter member for cutting off unnecessary light are mixed in a binder resin.
(vi) A laminated member of a member (fluorescent converting layer) where a fluorescent dye is dispersed in a binder resin, and a color filter member (color filter layer) for cutting off unnecessary light.

Among these members, the members of (i), (iii), (v) and (vi) containing a fluorescent dye are preferred, and the member of (vi) is particularly preferred.

The luminance converting ratio of a green converting member converting blue to bluish green light from an organic EL element to green light is preferably 50% or more, more preferably 60% or more. If it is less than 50%, a white emission balance may be lost in color emission display, since the amount of a green component is small.

Here a luminance converting ratio $\eta^G$ is the value ($L_g \times 100$)/$L_d$ when a fluorescent converting layer receives light with a luminance $L_d$ [nit] emitted by an organic EL element and emits green light with a luminance $L_g$ [nit].

The luminance converting ratio of a red converting member converting to red light is preferably 10% or more, more preferably 15% or more. If it is less than 10%, a white emission balance may be lost in color emission display, since the amount of a red component is small.

Here a luminance converting ratio $\eta^R$ is the value ($L_r \times 100$)/$L_d$ when a fluorescent converting layer receives light with a luminance $L_d$ [nit] emitted by an organic EL element and emits red light with a luminance $L_r$ [nit].

A constituent material for the color converting member will be described below.

(1) Fluorescence Converting Layer

Materials similar to the above-mentioned materials can be exemplified as a fluorescent dye converting blue to bluish green light from an organic EL element to green light, and a fluorescent dye converting blue to green light from an organic EL element to orange to red light.

Dependently on the spectrum form of light emitted from an organic EL element, a fluorescent dye converting to blue light, a fluorescent dye converting to green light, and a fluorescent dye converting to orange to red light may be mixed and used.

Further, various dyes can be used if they have fluorescence.

Pigments may also be used in which a fluorescent dye is beforehand kneaded into various pigment resins.

As the binder resin, there may be used a non-curing resin, a photocuring resin, a thermosetting resin such as epoxy resins, or the like. These binder resins may be used alone or in combination of two or more thereof.

For a full-color device, in order to separate and arrange the color-converting member two-dimensionally, it is preferred to use, as the binder resin, a photosensitive resin to which photolithography can be applied.

(1) Photosensitive Resin

As the photosensitive resin, resins similar to the above-mentioned resins are exemplified.

The above-mentioned photosensitive resin comprises a reactive oligomer, a polymerization initiator, a polymerization accelerator, a monomer as a reactive diluting agent or the like. Suitable examples of the reactive oligomer are as follows:

epoxy acrylates obtained by adding acrylic acid to a bisphenol type epoxy resin or a novolac type epoxy resin;

polyurethane acrylates obtained by reacting a multifunctional isocyanate with 2-hydroxyethyl acrylate and a multifunctional alcohol, the mole numbers of which are equal, at an arbitrary mole ratio;

polyester acrylates obtained by reacting a multifunctional alcohol with acrylic acid and a multifunctional carboxylic acid, the mole numbers of which are equal, at an arbitrary mole ratio;

polyether acrylates obtained by reacting a polyol with acrylic acid;

reactive polyacrylates obtained by reacting epoxy groups of side chains of poly(methyl methacrylate-CO-glycidyl methacrylate) or the like with acrylic acid;

carboxyl-modified epoxy acrylates obtained by partially modifying an epoxy acrylate with a dibasic carboxylic acid anhydride;

carboxyl-modified reactive polyacrylates obtained by partially modifying a reactive polyacrylate with a dibasic carboxylic acid anhydride;

polybutadiene acrylates having an acrylate group on a side chain of a polybutadiene oligomer;

silicone acrylates having, on its main chain, a polysiloxane bond; and amino-plast resin acrylates, obtained by modifying an amino-plast resin.

The polymerization initiator is not particularly limited and any initiators can be used which are generally used in polymerization of vinyl monomers or the like. Examples thereof include organic peroxides such as benzophenones, acetophenones, benzoins, thioxanthones, anthraquniones, and azobisisobutyronitrile.

Preferred examples of the polymerization accelerator include triethanolamine, 4,4'-dimethylaminobenzophenone (Michler's ketone), and ethyl 4-dimethylaminobenzoate. Examples of a monomer as the reactive diluting agent, for example, for radical polymerization system include mono-funtional monomers such as acrylic acid esters and methacrylic acid esters; multifunctional monomers such as trimethylolpropane triacrylate, pentaerythritol triacrylate and dipentaerythritol hexaacrylate; and oligomers such as polyester acrylates, epoxy acrylates, urethane acrylates and polyether acrylates.

(2) Non-curing Resin

As the non-curing binder resin, there is preferably used, for example, polymethacrylic acid ester, polyvinyl chloride, vinyl chloride/vinyl acetate copolymer, alkyd resin, aromatic sulfonamide resin, urea resin, melamine resin, or benzoguanamine resin. Among these binder resins, benzoguamamine resin, melamine resin, and vinyl chloride resin are particularly preferred. These binder resins may be used alone or in combination of two or more thereof.

Besides the above-mentioned binder resins, a binder resin for dilution may be used. Examples thereof include polymethyl methacrylates, polyacrylates, polycarbonates, polyesters, polyvinyl alcohols, polyvinyl pyrrolidones, hydroxyethylcelluloses, carboxymethylcelluloses, polyamides, silicones and epoxy resins, one of which or any combination of two or more selected from which may be used.

As an additive, a substance satisfying the relationship of $^3Eq<^3Ed$ wherein $^3Eq$ represents the lowest excited triplet energy level of the additive and $^3Ed$ represents the lowest excited triplet energy level of the fluorescent dye. In the case of a composition in which plural fluorescent dyes are mixed, the additive is selected in such a manner that the above-mentioned relationship is satisfied for the fluorescent dye having a fluorescent peak of the longest wavelength.

The fluorescence converting layers can be obtained by applying a resin composition therefor to a film with a desired thickness on a substrate made of glass or the like.

When the film is formed, in order to enhance the dispersibility of the above-mentioned respective components, it is advisable to use a solvent to dissolve and mix the components. As a suitable solvent, preferred is ethylene glycol monomethyl ether, ethylene glycol monoethyl ether, 2-acetoxy-1-methoxypropane, 1-acetoxy-2-ethoxyethane, cyclohexanone, toluene, or the like.

Various known methods such as spin coating, printing, or coating can be used for forming the film. Spin coating is preferred. In such a film-forming method, the fluorescence converting layer is formed in a thickness necessary for converting incident light into light having a desired wavelength. The thickness may be properly selected in the range of usually 1 to 100 µm, preferably 1 to 20 µm.

To obtain a full-color emission device by the fluorescence-converting process, it is necessary to arrange fluorescence converting layers of the three primary colors R, G and B two-dimensionally on a substrate. For this arrangement, after the formation of films as described above, the films are etched by photolithography, heated and hardened according to ordinary production methods of fluorescence converting layers, thereby producing the fluorescence converting layers. A preferred heating temperature is selected dependently on the kind of the photoresist material. The heating treatment may be conducted at 70 to 240° C. for 0.5 to 3 hours.

(2) Color Filter Layer

Examples of a color filter (layer) include an interference filter, a band pass filter, which are each made of an inorganic material, and a color filter made of an organic material. The organic color filter, which is rich in materials such as dyes and easy to work, is preferred. As a color filter material, the above-mentioned dyes and binder resins are exemplified.

The ratio of a dye to a binder resin is preferably from 1:99 to 90:10 (weight ratio). If the amount of the dye is less than 1%, the color filter cannot cut surrounding light sufficiently. If the amount is more than 90%, the properties of the film deteriorate so that the mechanical strengths thereof such as adhesion strength lower to a brittle film. The ratio is more preferably from 10:90 to 50:50 (weight ratio). The film thickness of the color filter, which can be set within an arbitrary range as far as the function of the color filter is not damaged, is usually from 1 µm to 10 mm, preferably from 1 µm to 500 µm, and more preferably from 1 µm to 10 µm.

The red color filter layer preferably has a light-ray transmittance of 60% or less at a wavelength of 600 nm, more preferably 50% or less. If it exceeds 60%, it transmits light of wavelength less than 600 nm so that the red purity of a color emission device may not be pure red.

The green color filter preferably has a light-ray transmittance of 80% or more at a wavelength of 540 nm, more preferably 85% or more. If it is less than 80%, the green component amount of a color emission device becomes small so that the white balance may be lost.

The blue color filter preferably has a light-ray transmittance of 60% or more at a wavelength of 460 nm, more preferably 70% or more. If it is less than 60%, the blue component amount of a color emission device becomes small so that the white balance may be lost.

In the case that the color filter is two-dimensionally separated and arranged, it is preferred to use, as the binder resin, a photosensitive resin to which photolithography can be applied. In the case of using printing, printing ink (medium) using the above-mentioned transparent resin can be used.

The color filter is usually produced by mixing, dispersing or dissolving a fluorescent dye and a resin with/into a suitable solvent into a liquid form, and then forming the liquid into a film onto a given substrate by spin coating, roll coating, bar coating, casting, or the like. The color filter may be made into a dry film, and then adhered to a given substrate. In the case that the color filter is patterned, the patterning is generally performed by photolithography, screen printing or the like.

For such a color filter, only one layer is basically sufficient when a full-color or multicolor emission device that emits light of the three primary colors is produced. Thus, the device can be of simple structure and produced at low cost.

The above various members are formed on a substrate.

Examples of the substrate include a glass plate, a metal plate, a ceramic plate and a plastic plate (polycarbonate resin, acrylic resin, vinyl chloride resin, polyethylene terephthalate resin, polyimide resin, polyester resin, epoxy resin, phenol resin, silicone resin, fluorine resin or the like).

In order to prevent the invasion of water into the color emission device, the device is preferably subjected to a moisture proofing treatment or hydrophobic treatment by forming an inorganic film or applying a fluorine resin.

Further, in order to prevent the entry of water into the luminescent medium, a substrate is preferably subjected to a moisture proofing treatment or hydrophobic treatment to have a smaller water content or gas permeation coefficient. Specifically, a supporting substrate preferably have a water content of 0.0001% by weight or less and a gas permeation coefficient of $1\times10^{-13}$ cc·cm/cm²·sec.cmHg or less.

An organic EL element emitting a blue component and a yellow to red component in a certain peak intensity ratio, which is used in a color emission device of the invention, has a simpler structure and better reproducibility in element production, compared with an organic EL element containing the well-balanced three primary colors.

Further it has a higher efficiency and a longer durability, compared with a blue (or bluish green) organic EL element.

Assuming that a color emission device emits white light with the same luminance, the organic EL element used in the invention is advantageously needed to have only a weaker luminescence intensity, compared with a color emission device using a blue organic EL element as an organic EL element and the same color converting member as that of the invention.

This means that the color emission device with the organic EL element of the invention has a longer luminance half life and the color converting member used therein less deteriorates since the amount of light that the color converting member absorbs is small.

Thus there can be obtained a color emission device with a long durability, for example a half life more than 15000 hours.

In addition, a color emission device using the organic EL element of the invention has a stronger luminescence intensity, compared under the condition of the same applied voltage. Therefore the transmittance of a color filter used for improving color purity can be adjusted in the range where a luminescence intensity is not reduced, compared with a blue organic EL element.

Consequently the color emission device of the invention can specifically be used for color displays of monitor screens for digital cameras, video cameras, color televisions, car navigation systems, portable phones and computers.

EXAMPLES

Example 1

A black matrix (BM) material, V259BK (Nippon Steel Chemical Co., Ltd.), was spin-coated on a supporting substrate of 112 mm by 143 mm by 1.1 mm (OA2 glass, Nippon Electric Glass Co., Ltd.). The substrate was exposed to ultraviolet rays with a photo mask for forming a lattice-like pattern with openings of 68 μm by 285 μm, developed with a 2% aqueous solution of sodium carbonate and baked at 200° C. to form the pattern of a black matrix (film thickness 1.5 μm).

Next, a blue filter material, V259B (Nippon Steel Chemical Co., Ltd.), was spin-coated. The resultant substrate was exposed to ultraviolet rays with a photo mask for forming the pattern of 320 rectangle stripes (100 μm line, 230 μm gap) in alignment with the position of the black matrix, developed with a 2% aqueous solution of sodium carbonate and baked at 200° C. to form the pattern of a blue filter (film thickness 1.5 μm), which corresponds to blue pixels.

Next, a green filter material, V259G (Nippon Steel Chemical Co., Ltd.) was spin-coated. The resultant substrate was exposed to ultraviolet rays with a photo mask for forming the pattern of 320 rectangle stripes (100 μm line, 230 μm gap) in alignment with the position of the black matrix, developed with a 2% aqueous solution of sodium carbonate and baked at 200° C. to form the pattern of a green filter (film thickness 1.5 μm) adjacent the blue filter.

Next, a red filter material, CRY-S840B (FUJIFILM Arch Co., Ltd.), was spin-coated. The resultant substrate was exposed to ultraviolet rays with a photo mask for forming the pattern of 320 rectangle stripes (100 μm line, 230 μm gap) in alignment with the position of the black matrix, developed with a 2% aqueous solution of sodium carbonate and baked at 200° C. to form the pattern of a red filter (film thickness 1.5 μm) between the blue filter and green filter.

Coumarin 6 was dissolved in an acrylic negative photoresist (V259PA, solids content 50%, Nippon Steel Chemical Co., Ltd.) at a coumarin concentration of 0.04 mol/kg (solids) to prepare ink as a material for green converting member.

This ink was spin-coated on the above substrate. The resultant substrate was exposed to ultraviolet rays with the same photo mask as that used to form the color filter above the green filter, developed with a 2% aqueous solution of sodium carbonate and baked at 180° C. to form the pattern of a green converting member (film thickness 10 μm), which corresponds to green pixels.

Next 0.53 g of Coumarin 6, 1.5 g of basic violet 11 and 1.5 g of Rhodamine 6G were dissolved in 100 g of an acrylic negative photoresist (V259PA, solids content 50%, Nippon Steel Chemical Co., Ltd.) to prepare ink as a material for red converting member.

This ink was spin-coated on the above substrate. The resultant substrate was exposed to ultraviolet rays with the same photo mask as that used to form the color filter above the red filter, developed with a 2% aqueous solution of sodium carbonate and baked at 180° C. to form the pattern of a red converting member (film thickness 10 μm), which corresponds to red pixels.

Figure 6:
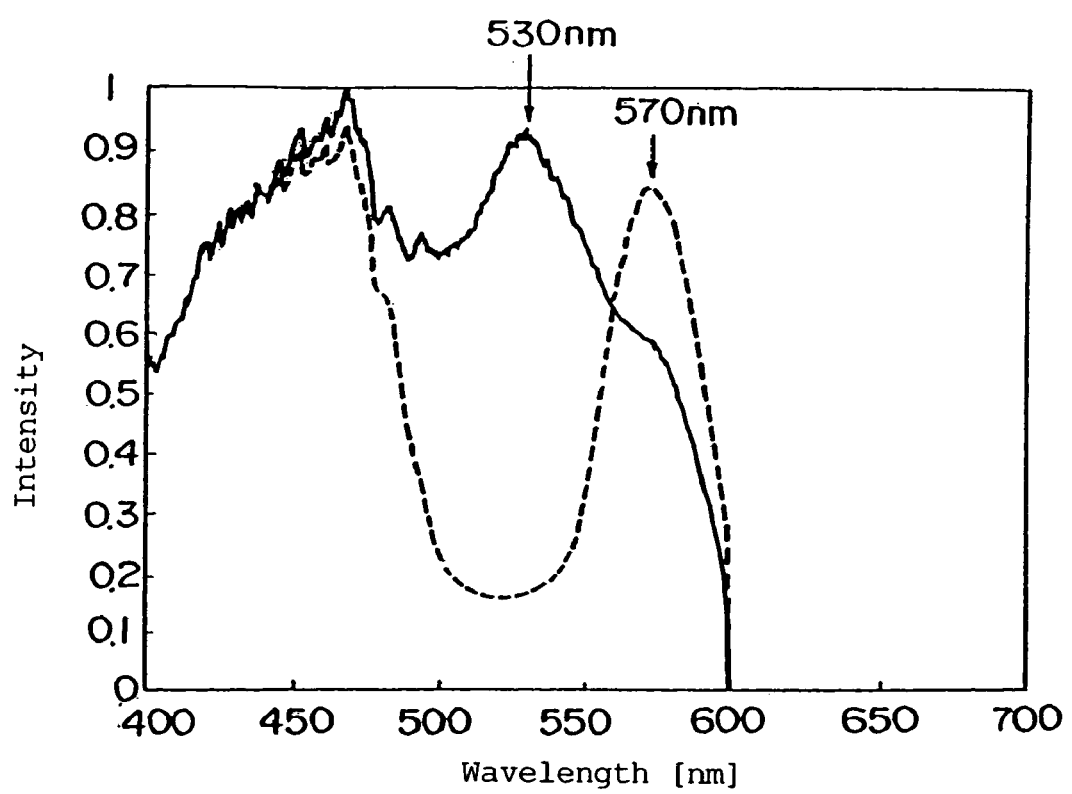
FIG. 6 shows excitation spectra of the red converting members of Example 1 and Comparative Example 2.

A red converting member that had been prepared in the same manner was measured for excitation spectrum at excitation wavelengths of 400 to 600 nm with a fluorescence measuring device as a probe of red, 600 nm. FIG. 6 shows the spectrum measured in full line. The peak wavelength was observed at 530 nm in the excitation spectrum of from 500 to 600 nm.

Next an acrylic thermosetting resin (V259PH, Nippon Steel Chemical Co., Ltd.) was spin-coated on the above substrate as a flattening film and baked at 180° C. to form a 5 μm-thick flattening film.

An IZO (indium zinc oxide) film was then formed by sputtering in a thickness of 200 nm.

A positive resist (HPR204, FUJIFILM OLIN) was spin coated on the substrate. The resultant substrate was exposed to ultraviolet rays with a photo mask for obtaining a stripe-like pattern with a 90 μm line and 20 μm gap, and a part for taking out cathode; developed with a developer of tetramethyl ammonium hydroxide; and baked at 130° C. to obtain a resist pattern.

Next IZO in the exposed parts was etched with an IZO etchant of 5% oxalic acid aqueous solution. The resist was processed with a release liquid mainly containing ethanolamine (N303: NAGASE & Co., Ltd.) to produce an IZO pattern (under electrode: anode, 960 lines) in position corresponding to the blue filter, green converting member and red converting member.

Next a negative resist (V259PA, Nippon Steel Chemical Co., Ltd.) was spin-coated on the substrate as a first inter-insulator. The resultant substrate was exposed to ultraviolet rays with a photo mask; developed with a developer of tetramethyl ammonium hydroxide; and baked at 180° C. to obtain an inter-insulator of lattice-like pattern coating edges of IZO. The opening of IZO was 70 μm by 290 μm.

Next a negative resist (ZPN1100, ZEON CORPORATION) was spin-coated as a second inter-insulator (separator walls). The resultant substrate was exposed to ultraviolet rays with a photo mask for obtaining a stripe pattern with a 20 µm line and 310 µm gap; and thereafter baked. The negative resist was developed with a developer of tetramethyl ammonium hydroxide to obtain a second inter-insulator (separator walls) of an organic film intersecting the IZO stripes at right angles.

The substrate thus obtained was subjected to ultrasonic cleaning with purified water and isopropyl alcohol, dried with air blow and thereafter cleaned with ultraviolet rays.

The substrate was moved into an organic deposition device (ULVAC Co., Ltd.) and fixed in a substrate holder. Heating boards made of molybdenum were filled in advance with 4,4',4"-tris[N-(3-methylphenyl)-N-phenylamino]triphenylamine (MTDATA) as a hole injecting material, 4,4'-bis[N-(1-naphthyl)-N-phenylamino]biphenyl (NPD) and 4,4'-bis(2,2-diphenylvinyl)biphenyl(DPVBi) as a host material of emitting material, Rubrene and 1,4-bis[4-(N,N-diphenylaminostyrylbenzene)] (DPAVB) as a doping material, and tris(8-quinolinol)aluminum (Alq) as an electron injecting material, respectively. In addition, an Al/Li alloy (Li content: 10 atm %) was mounted in a tungsten filament as a cathode.

After the pressure in a vacuum vessel was reduced to $5 \times 10^{-7}$ torr, from a hole-injecting layer to a cathode were laminated in the following order, while maintaining vacuum or vacuuming one time.

MTDATA was deposited in a thickness of 60 nm at a deposition speed of 0.1 to 0.3 nm/second as a hole injecting layer; NPD as a host and Rubrene as a dopant were co-deposited at 0.1 to 0.3 nm/second and at 0.0005 to 0.0015 nm/second, respectively in a thickness of 20 nm as a first emitting layer; DPVBi as a host and DPAVB as a dopant were co-deposited at 0.1 to 0.3 nm/second and at 0.003 to 0.008 nm/second, respectively in a thickness of 40 nm as a second emitting layer; Alq was deposited in a thickness of 20 nm at 0.1 to 0.3 nm/second as an electron injecting layer; and Al and Li were deposited in a thickness of 150 nm at 0.5 to 1.0 nm/second as a cathode.

The organic layers (hole injecting layer to electron injecting layer) were deposited with a mask in the region covering color filters and color converting members. The cathode was deposited with a mask so as to connect with an electrode for taking out IZO, which electrode had been previously formed. The cathode (upper electrode) was automatically separated by the separator walls that had been formed on the substrate to form a pattern intersecting under electrodes (240 lines).

The organic EL element thus formed on the substrate was moved in a dry box through which dried nitrogen flowed without contacting to the atmosphere. In this dry box, a display part was covered with a sealing substrate of blue glass plate and a cation curable adhesive (TB3102, Three Bond Co., Ltd.) was photo-cured about the periphery of the display part for sealing.

In order to observe the emission spectrum of the organic EL element, a monochrome substrate on which no color filters and color converting members were formed, and an organic EL element was formed under the same conditions.

As stated above, the organic EL devices for monochrome and full-color were obtained where under and upper electrodes formed an XY matrix. When a DC voltage was applied across the under and upper electrodes (under electrode: (+), upper electrode: (−)), the intersections of electrodes, pixels, each emitted light.

The monochrome device was measured for emission spectrum with a chroma meter (CS1000, MINOLTA Co., Ltd.). As a result, it was found that it substantially coincided with $I_1$ shown in FIG. 2(A) (peak intensity in the blue range:peak intensity in the range other than the blue range=0.9:0.1) and the peak wavelength (530 nm) of excitation spectrum of the red converting member in the range of from 500 to 600 nm substantially coincided with the peak wavelength (535 nm) of emission spectrum of the organic EL element in the range other than the blue range (500 to 600 nm).

A voltage was selectively applied to only red pixels for emission and its emission spectrum was measured with the chroma meter (CS1000, MINOLTA Co., Ltd.). Table 2 shows the results.

For the full-color device, the same voltage was applied to blue, green and red pixels to let them emit light simultaneously. The measurement of chromaticity by the chroma meter (CS1000, MINOLTA Co., Ltd.) showed that CIE chromaticity coordinate was X=0.24 and Y=0.23 in the white range, which coincided with the simulation results.

Example 2

Full-color and monochrome organic EL devices were produced under the same conditions as those of Example 1 except that NPD as a host and Rubrene as a dopant were co-deposited at 0.1 to 0.3 nm/second and at 0.0015 to 0.0045 nm/second, respectively, as the first emitting layer of organic EL element. When a DC voltage was applied across the under and upper electrodes (under electrode: (+), upper electrode: (−)), the intersections of electrodes, pixels, each emitted light.

The monochrome device was measured for emission spectrum with the chroma meter (CS1000, MINOLTA Co., Ltd.). As a result, it was found that it substantially coincided with $I_3$ shown in FIG. 2(A) (peak intensity in the blue range:peak intensity in the range other than the blue range=0.7:0.3) and the peak wavelength (530 nm) of excitation spectrum of the red converting member in the range of from 500 to 600 nm substantially coincided with the peak wavelength (535 nm) of emission spectrum of the organic EL element in the range other than the blue range (500 to 600 nm).

A voltage was selectively applied to only red pixels for emission and its emission spectrum was measured with the chroma meter (CS1000, MINOLTA Co., Ltd.). Table 2 shows the results.

For the full-color device, the same voltage was applied to blue, green and red pixels to let them emit light simultaneously. The measurement of chromaticity by the chroma meter (CS1000, MINOLTA Co., Ltd.) showed that CIE chromaticity coordinate was X=0.26 and Y=0.30 in the white range, which coincided with the simulation results.

Example 3

Full-color and monochrome organic EL devices were produced under the same conditions as those of Example 1 except that NPD as a host and Rubrene as a dopant were co-deposited at 0.1 to 0.3 nm/second and at 0.0025 to 0.0075 nm/second, respectively, as the first emitting layer of organic EL element. When a DC voltage was applied across the under and upper electrodes (under electrode: (+), upper electrode: (−)), the intersections of electrodes, pixels, each emitted light.

The monochrome device was measured for emission spectrum with the chroma meter (CS1000, MINOLTA Co., Ltd.). As a result, it was found that it substantially coincided with $I_5$ shown in FIG. 2(A) (peak intensity in the blue range:peak intensity in the range other than the blue range=0.5:0.5) and the peak wavelength (530 nm) of excitation spectrum of the red converting member in the range of from 500 to 600 nm substantially coincided with the peak wavelength (535 nm) of emission spectrum of the organic EL element in the range other than the blue range (500 to 600 nm).

A voltage was selectively applied to only red pixels for emission and its emission spectrum was measured with the chroma meter (CS1000, MINOLTA Co., Ltd.). Table 2 shows the results.

For the full-color device, the same voltage was applied to blue, green and red pixels to let them emit light simultaneously. The measurement of chromaticity by the chroma meter (CS1000, MINOLTA Co., Ltd.) showed that CIE chromaticity coordinate was X=0.29 and Y=0.37 in the white range, which coincided with the simulation results.

Example 4

Full-color and monochrome organic EL devices were produced under the same conditions as those of Example 1 except that NPD as a host and Rubrene as a dopant were co-deposited at 0.1 to 0.3 nm/second and at 0.0030 to 0.0090 nm/second, respectively, as the first emitting layer of organic EL element. When a DC voltage was applied across the under and upper electrodes (under electrode: (+), upper electrode: (−)), the intersections of electrodes, pixels, each emitted light.

The monochrome device was measured for emission spectrum with the chroma meter (CS1000, MINOLTA Co., Ltd.). As a result, it was found that it substantially coincided with $I_6$ shown in FIG. 2(A) (peak intensity in the blue range:peak intensity in the range other than the blue range=0.4:0.6) and the peak wavelength (530 nm) of excitation spectrum of the red converting member in the range of from 500 to 600 nm substantially coincided with the peak wavelength (535 nm) of emission spectrum of the organic EL element in the range other than the blue range (500 to 600 nm).

A voltage was selectively applied to only red pixels for emission and its emission spectrum was measured with the chroma meter (CS1000, MINOLTA Co., Ltd.). Table 2 shows the results.

For the full-color device, the same voltage was applied to blue, green and red pixels to let them emit light simultaneously. The measurement of chromaticity by the chroma meter (CS1000, MINOLTA Co., Ltd.) showed that CIE chromaticity coordinate was X=0.30 and Y=0.41 out of the white range, which coincided with the simulation results.

Comparative Example 1

Full-color and monochrome organic EL devices were produced under the same conditions as those of Example 1 except that Rubrene was not used in the first emitting layer of organic EL element. When a DC voltage was applied across the under and upper electrodes (under electrode: (+) upper electrode: (−)), the intersections of electrodes, pixels, each emitted light.

The monochrome device was measured for emission spectrum with the chroma meter (CS1000, MINOLTA Co., Ltd.). As a result, it was found that it substantially coincided with $I_0$ shown in FIG. 2(A) (peak intensity in the blue range:peak intensity in the range other than the blue range=1:0).

A voltage was selectively applied to only red pixels for emission and its emission spectrum was measured with the chroma meter (CS1000, MINOLTA Co., Ltd.). Table 2 shows the results.

For the full-color device, the same voltage was applied to blue, green and red pixels to let them emit light simultaneously. The measurement of chromaticity by the chroma meter (CS1000, MINOLTA Co., Ltd.) showed that CIE chromaticity coordinate was X=0.23 and Y=0.21 out of the white range, which coincided with the simulation results.

Comparative Example 2

Ink was prepared to form the red converting member under the same conditions as those of Example 1 except that Rhodamine 6G was not used as a material for red converting member.

The red converting member was measured for excitation spectrum at excitation wavelengths of 400 to 600 nm with the fluorescence measuring device as a probe of red, 600 nm. As shown in FIG. 6 in dotted line, spectrum without a maximum peak in 520 to 550 nm was observed and the peak wavelength was 570 nm.

Full-color and monochrome organic EL devices were produced under the same conditions as those of Example 3. When a DC voltage was applied across the under and upper electrodes (under electrode: (+), upper electrode: (−)), the intersections of electrodes, pixels, each emitted light.

The monochrome device was measured for emission spectrum with the chroma meter (CS1000, MINOLTA Co., Ltd.). As a result, it was found that it substantially coincided with $I_5$ shown in FIG. 2(A) (peak intensity in the blue range:peak intensity in the range other than the blue range=0.5:0.5) but the peak wavelength (570 nm) of excitation spectrum of the red converting member in the range of from 500 to 600 nm did not coincide with the peak wavelength (535 nm) of emission spectrum of the organic EL element in the range other than the blue range (500 to 600 nm).

A voltage was selectively applied to only red pixels for emission and its emission spectrum was measured with the chroma meter (CS1000, MINOLTA Co., Ltd.). Table 2 shows the results.

For the full-color device, the same voltage was applied to blue, green and red pixels to let them emit light simultaneously. The measurement of chromaticity by the chroma meter (CS1000, MINOLTA Co., Ltd.) showed that CIE chromaticity coordinate was X=0.24 and Y=0.37 out of the white range.

Table 2 shows the luminescence intensity of red pixels wherein the red intensity of Comparative Example 1 was standardized as 100, and CIE chromaticity coordinates at the time of all lighting of full-color organic EL device wherein the same voltage was applied to blue, green and red in Examples 1 to 4 and Comparative Examples 1 and 2.

TABLE 2

|  | Red intensity | Chromaticity at the time of all lighting | |
| --- | --- | --- | --- |
|  |  | CIE-x | CIE-y |
| Example 1 | 101.0 | 0.24 | 0.23 |
| Example 2 | 103.0 | 0.26 | 0.30 |
| Example 3 | 104.8 | 0.29 | 0.37 |
| Example 4 | 105.7 | 0.30 | 0.41 |
| Com. Exam. 1 | 100.0 | 0.23 | 0.21 |
| Com. Exam. 2 | 73.0 | 0.26 | 0.37 |

Figure 7:
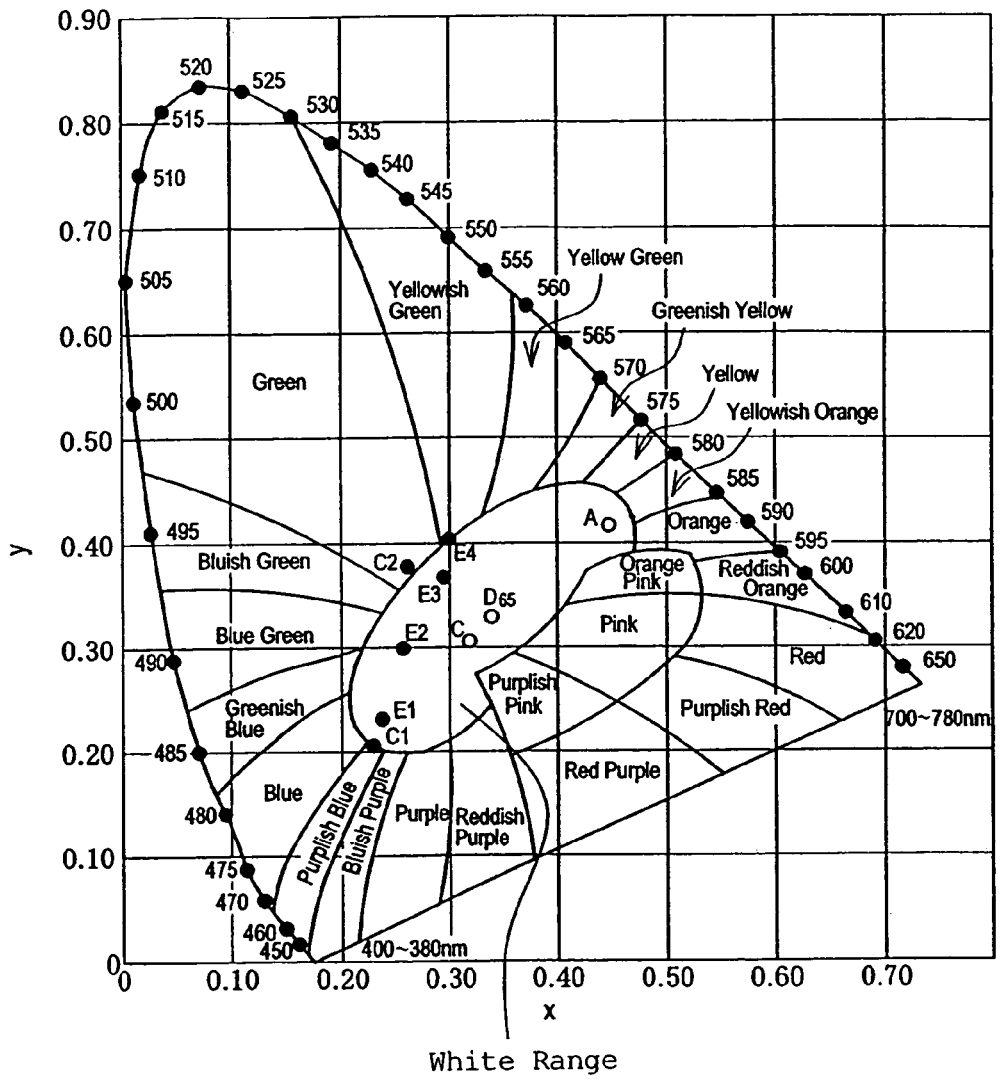
FIG. 7 shows a CIE chromaticity diagram of the organic EL devices of Examples 1 to 4 and Comparative Examples 1 to 2.

FIG. 7 shows CIE chromaticity at the time of all lighting of full-color organic EL device wherein the same voltage was applied to blue, green and red.

As shown in Table 2 and FIG. 7, the luminescence intensity of red pixels was high in Examples 1 to 4 since at least one peak in the excitation spectrum of red converting member coincided with an emission peak in the range other than the blue range (500 to 600 nm). Further, the full-color organic EL devices had the good white balance in Examples 1 to 3 since the organic EL elements had a approximate luminescence intensity in the range other than the blue range (intensity in the blue range intensity in the range other than the blue range=1:9 to 5:5).

In contrast, the red intensity was extremely low and white balance was not obtained in Comparative Examples 1 and 2 since the organic EL elements did not have a peak that corresponded to a peak in the excitation spectrum of red converting member in the range other than the blue range.

Example 5

A color emission device of the example will be described with reference to drawings.

Figure 8:
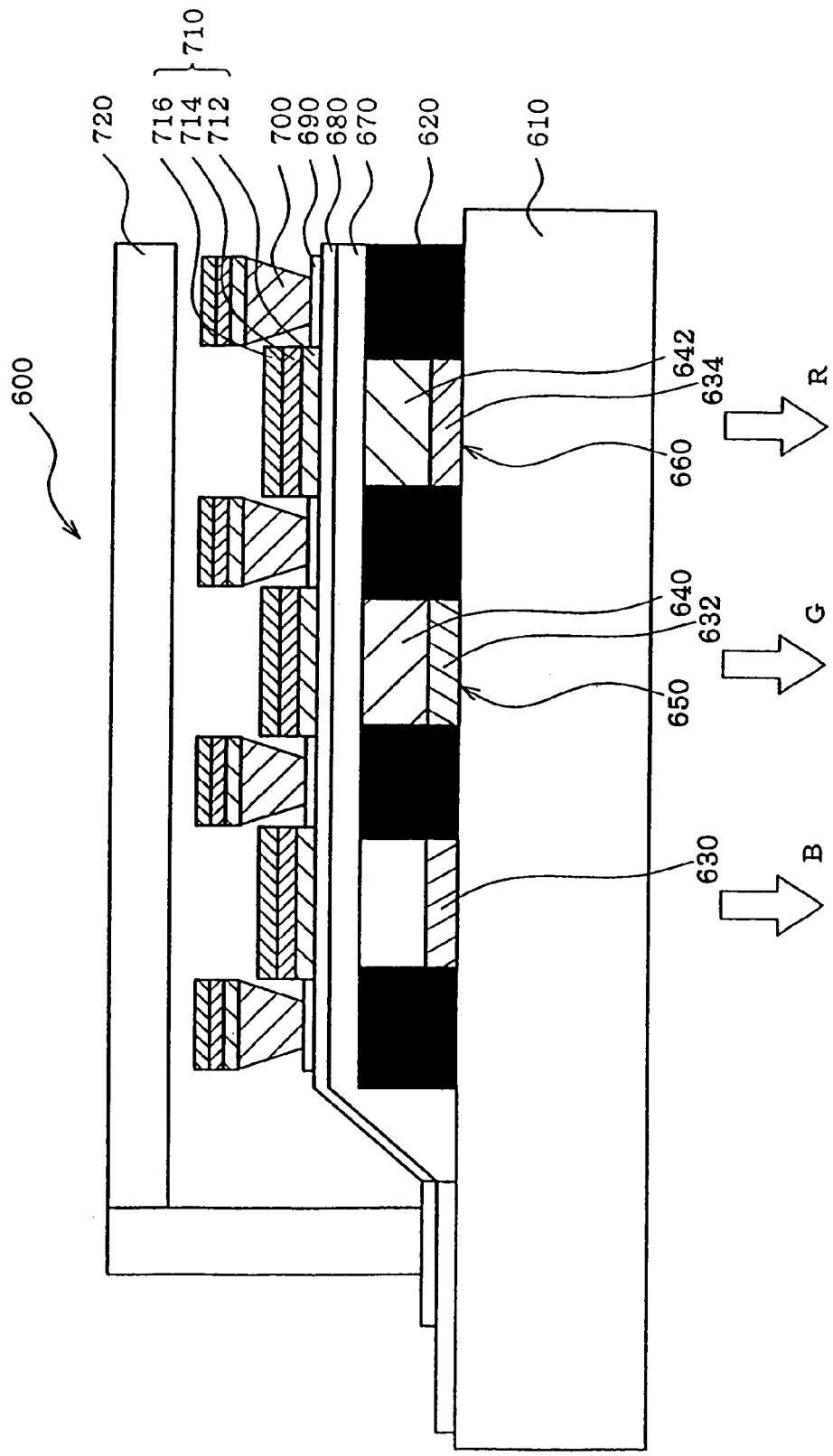
FIG. 8 is a diagram of the color emission device produced in Example 5.

FIG. 8 is a diagram of the color emission device produced in Example 5.

A black matrix (BM) material, V259BK (Nippon Steel Chemical Co., Ltd.), was spin-coated on a supporting substrate 610 of 112 mm by 143 mm by 1.1 mm (OA2 glass, Nippon Electric Glass Co., Ltd.). The substrate was exposed to ultraviolet rays with a photo mask for forming a lattice-like pattern, developed with a 2% aqueous solution of sodium carbonate and baked at 200° C. to form the pattern of a black matrix 620 (film thickness 1.5 μm).

The following blue filter 630, green filter 632 and red filter 634 were sequentially formed such that the gaps between the BM materials were filled.

A blue filter material of pigment type (V259B-050X, Nippon Steel Chemical Co., Ltd., referred to as BCF1 hereinafter) was spin-coated. The resultant substrate was exposed to ultraviolet rays with a photo mask for forming the pattern of 320 rectangle stripes (90 μm line, 240 μm gap) in alignment with the position of the black matrix, developed with a 2% aqueous solution of sodium carbonate and baked at 200° C. to form the pattern of the blue filter 630 (BCF1, film thickness 1.8 μm).

Figure 9:
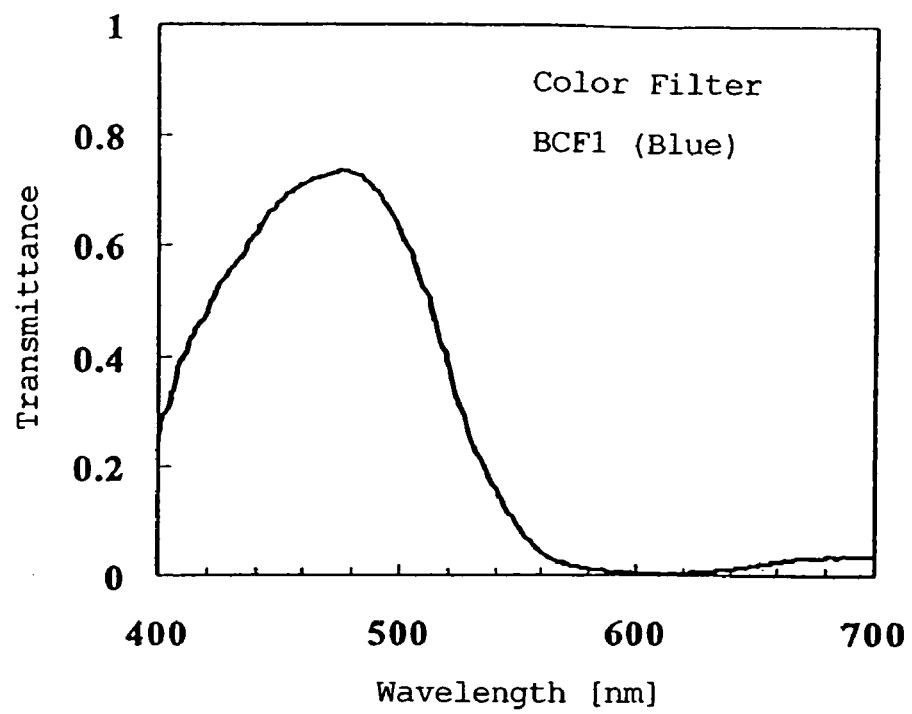
FIG. 9(A) shows the measurement results of the transmittance inside the pattern of BCF1 measured by microspectrophotometry.
FIG. 9(B) shows the measurement results of the transmittance inside the pattern of GCF1 measured by microspectrophotometry.
FIG. 9(C) shows the measurement results of the transmittance inside the pattern of RCF1 measured by microspectrophotometry.
FIG. 9(D) shows the measurement results of the transmittance inside the pattern of BCF2 measured by microspectrophotometry.
FIG. 9(E) shows the measurement results of the transmittance inside the pattern of GCF2 measured by microspectrophotometry.
FIG. 9(F) shows the measurement results of the transmittance inside the pattern of RCF2 measured by microspectrophotometry.
Figure 9:
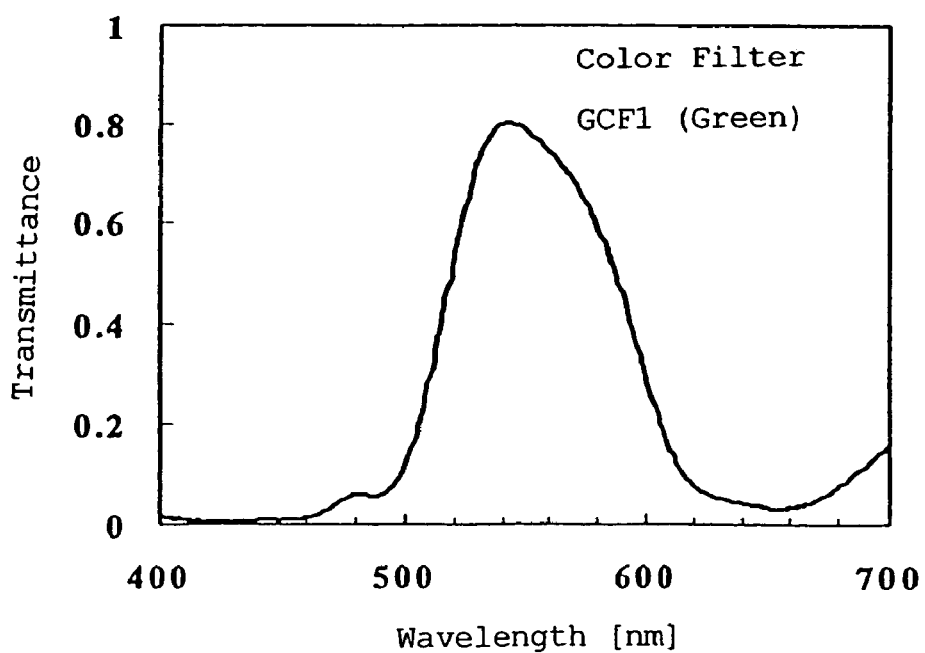
Figure 9:
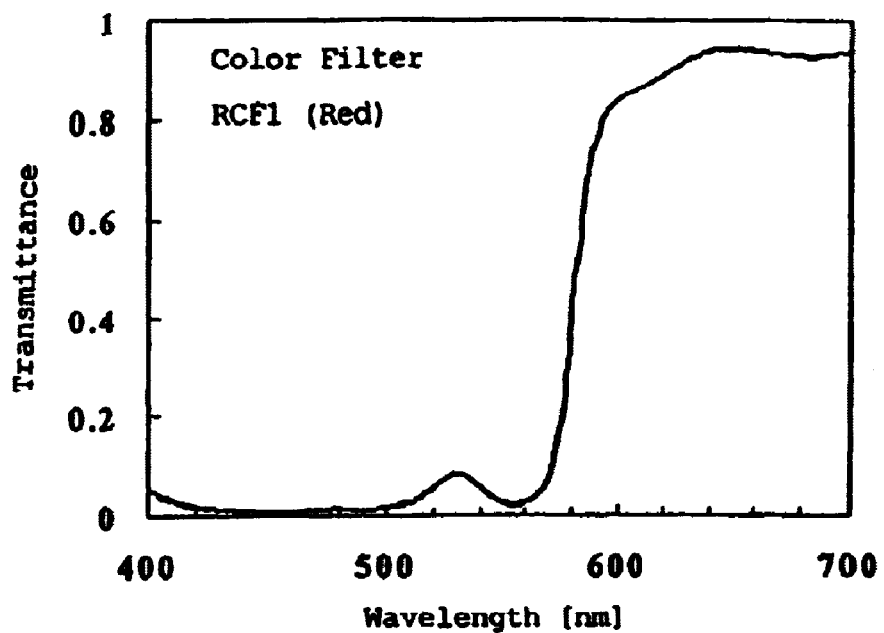
Figure 9:
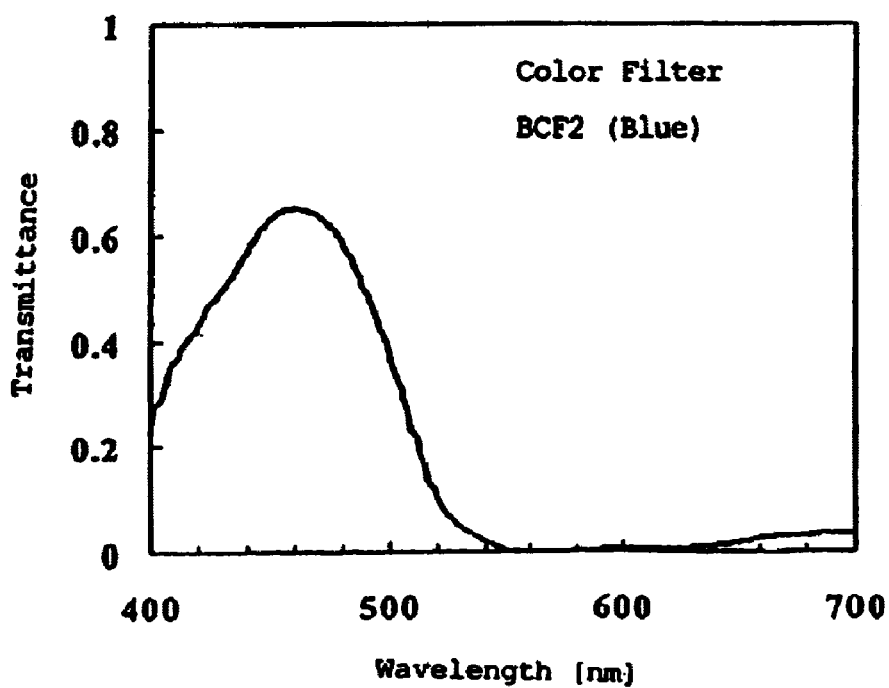
Figure 9:
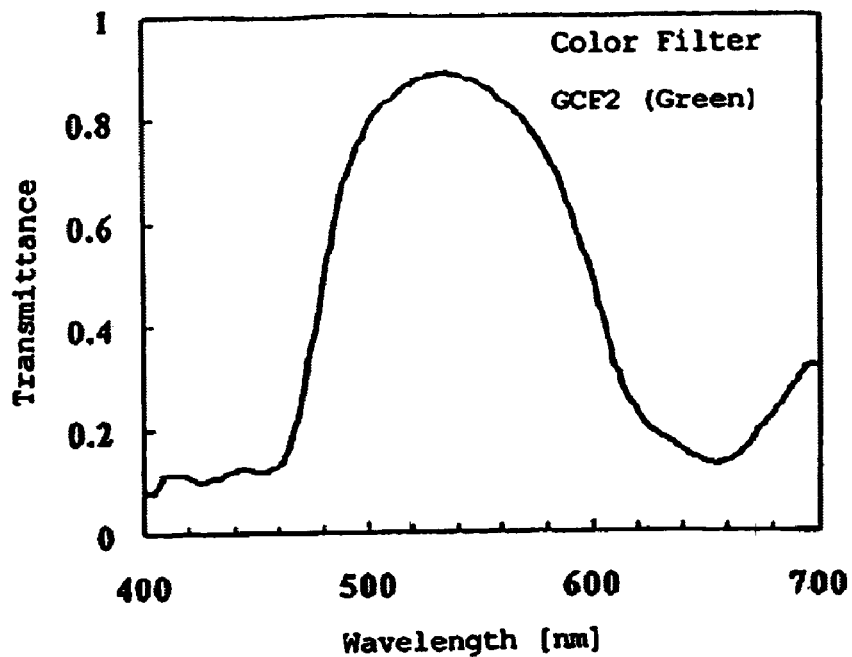
Figure 9:
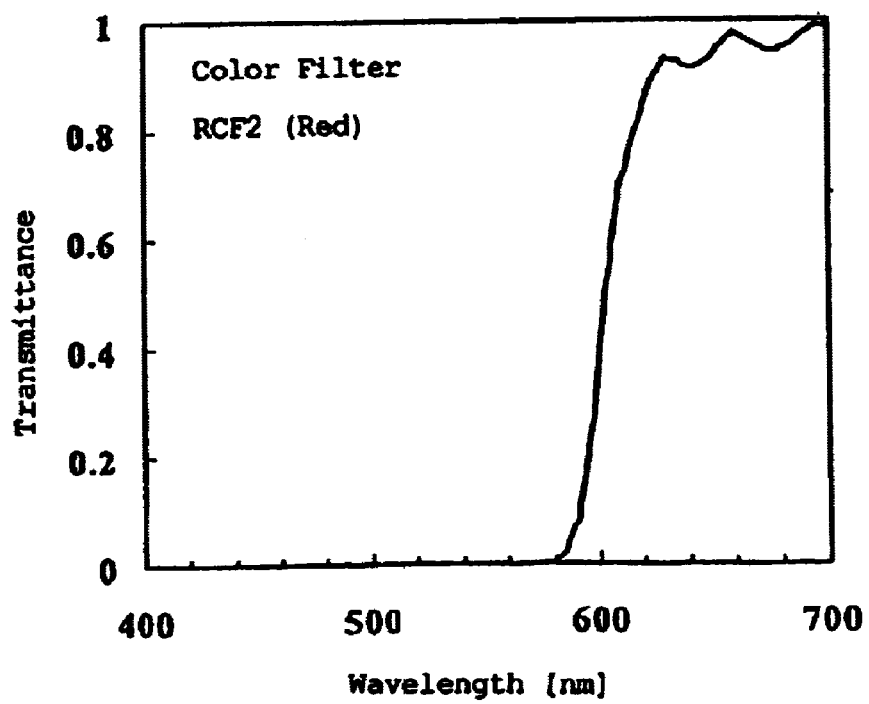

The transmittance inside the pattern of BCF1 was measured by microspectrophotometry. FIG. 9(A) shows the results.

The blue filter 630 constituted a blue converting member in this example.

A green filter material of pigment type (V259G-095X, Nippon Steel Chemical Co., Ltd., referred to as GCF1 hereinafter) was spin-coated. The resultant substrate was exposed to ultraviolet rays with a photo mask for forming the pattern of 320 rectangle stripes (90 μm line, 240 μm gap) in alignment with the position of the black matrix, developed with a 2% aqueous solution of sodium carbonate and baked at 200° C. to form the pattern of the green filter 632 (GCF1, film thickness 2.0 μm) adjacent the blue filter 630.

The transmittance inside the pattern of GCF1 was measured by microspectrophotometry. FIG. 9(B) shows the results.

A red filter material of pigment type (CRY-S840B, FUJIFILM Arch Co., Ltd., referred to as RCF1 hereinafter) was spin-coated. The resultant substrate was exposed to ultraviolet rays with a photo mask for forming the pattern of 320 rectangle stripes (90 μm line, 240 μm gap) in alignment with the position of the black matrix, developed with a 2% aqueous solution of sodium carbonate and baked at 200° C. to form the pattern of the red filter 634 (RCF1, film thickness 1.2 μm) between the blue filter 630 and green filter 632.

The transmittance inside the pattern of RCF1 was measured by microspectrophotometry. FIG. 9(C) shows the results.

The following green fluorescence converting layer 640 and red fluorescence converting layer 642 were sequentially formed on the green filter 632 and red filter 634, respectively.

Coumarin 6 was dissolved in an acrylic negative photoresist (V259PA, Nippon Steel Chemical Co., Ltd.) at a coumarin concentration of 0.04 mol/kg (solids) to prepare ink as a material for green fluorescence converting layer 640.

This ink was spin-coated on the above substrate with the color filter formed thereon. The resultant substrate was exposed to ultraviolet rays with the same photo mask as that used to form the color filter above the green filter 632, developed with a 2% aqueous solution of sodium carbonate and baked at 180° C. to form the pattern of a green fluorescence converting layer 640 (film thickness 10 μm).

The green filter 632 and green fluorescence converting layer 640 constituted a green converting member 650.

Figure 10:
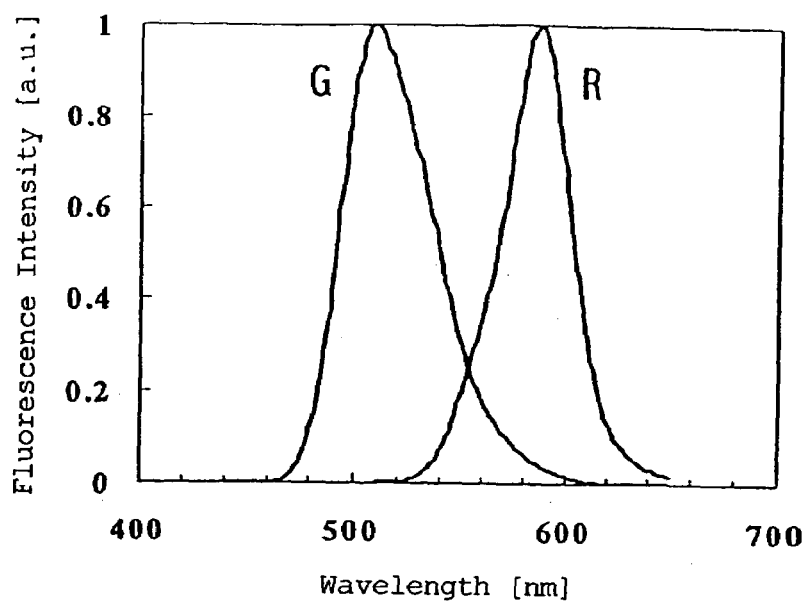
FIG. 10 shows the fluorescence spectrum measured by microspectrophotometry when the surface of green or red fluorescence converting layer is irradiated with light with an excitation wavelength of 430 nm.

The fluorescence spectrum was measured by microspectrophotometry when the surface of green fluorescence converting layer 640 was irradiated with light with an excitation wavelength of 430 nm. FIG. 10 shows the fluorescence spectrum. In FIG. 10, G represents the spectrum of green fluorescence converting layer 640.

Next 0.53 g of Coumarin 6, 1.5 g of basic violet 11 and 1.5 g of Rhodamine 6G were dissolved in 100 g of an acrylic negative photoresist (V259PA, Nippon Steel Chemical Co., Ltd.) to prepare ink as a material for red fluorescence converting layer 642.

This ink was spin-coated on the above substrate with the green fluorescence converting layer 640 formed thereon. The resultant substrate was exposed to ultraviolet rays with the same photo mask as that used to form the color filter above the red filter 634, developed with a 2% aqueous solution of sodium carbonate and baked at 180° C. to form the pattern of a red fluorescence converting layer 642 (film thickness 10 μm).

The red filter 634 and red fluorescence converting layer 642 constituted a red converting member 660.

The fluorescence spectrum was measured by microspectrophotometry when the surface of red fluorescence converting layer 642 was irradiated with light with an excitation wavelength of 430 nm. FIG. 10 shows the fluorescence spectrum. In FIG. 10, R represents the spectrum of red fluorescence converting layer 642.

Next an acrylic thermosetting resin (V259PH, Nippon Steel Chemical Co., Ltd.) was spin-coated on the above substrate with the red fluorescence converting layer 642 formed thereon as a flattening film 670 and baked at 180° C. to form a 5 μm-thick flattening film 670.

An IZO (indium zinc oxide) film was then formed by sputtering in a thickness of 220 nm as an anode 680. Next, a positive resist (HPR204, FUJIFILM OLIN) was spin coated on the substrate. The resultant substrate was exposed to ultraviolet rays with a photo mask for obtaining a stripe-like pattern with a 90 μm line and 20 μm gap and a part for taking out cathode 716; developed with a developer of tetramethyl ammonium hydroxide; and baked at 130° C. to obtain a resist pattern.

Next IZO in the exposed parts was etched with an etchant of 5% oxalic acid aqueous solution. The resist was processed with a release liquid mainly containing ethanolamine to produce an IZO pattern (anode, 960 lines) in position corresponding to the blue filter 630, green fluorescence converting layer 640 and red fluorescence converting layer 642.

A negative resist (V259PA, Nippon Steel Chemical Co., Ltd.) was spin-coated as a first inter-insulator 690. The resultant substrate was exposed to ultraviolet rays with a photo mask; and developed with a developer of tetramethyl ammonium hydroxide.

Next it was baked at 180° C. and the edges of IZO were coated to form an inter-insulator 690. The opening of IZO was 70 μm by 290 μm.

Next a negative resist (ZPN1100, ZEON CORPORATION) was spin-coated as a second inter-insulator 700 (cathode separator walls). The resultant substrate was exposed to ultraviolet rays with a photo mask for obtaining a stripe pattern with a 20 μm line and 310 μm gap; and thereafter baked. The negative resist was developed with a developer of tetramethyl ammonium hydroxide to obtain a second inter-insulator 700 intersecting the IZO stripes at right angles.

The substrate thus obtained was subjected to ultrasonic cleaning with purified water and isopropyl alcohol, dried with air blow and thereafter cleaned with ultraviolet ozone.

An organic EL element 710 was thereafter formed in an organic deposition device in which a hole injecting layer 712, hole transporting layer, emitting layer 714 (yellow to red emitting layer, blue emitting layer), electron injecting layer and cathode 716 were deposited under a vacuum in that order. The materials and film thicknesses of the layers each were as follows:

Hole injecting layer: The material of the formula [1] below was used. It had a thickness of 60 nm.

Hole transporting layer: The material of the formula [2] below was used. It had a thickness of 20 nm.

Yellow to red emitting layer: The material H of the formula [3] below and material B of the formula [4] below were used at a ratio of 5:0.01. It had a thickness of 5 nm.

Blue emitting layer: The material H and material A of the formula [5] below were used at a ratio of 35:1. It had a thickness of 35 nm.

Electron injecting layer: Alq was used. It had a thickness of 20 nm.

Cathode: Al and Li were used. It had a thickness of 150 nm.

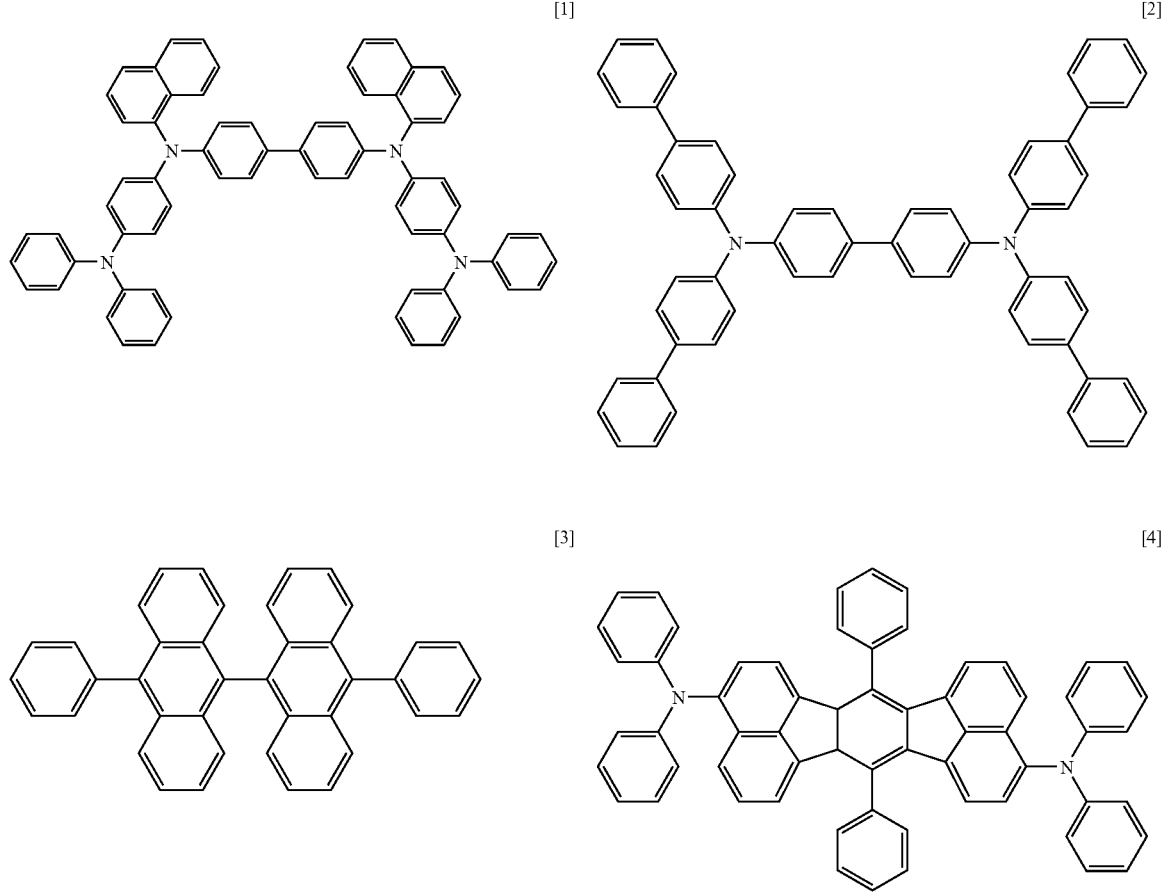

-continued

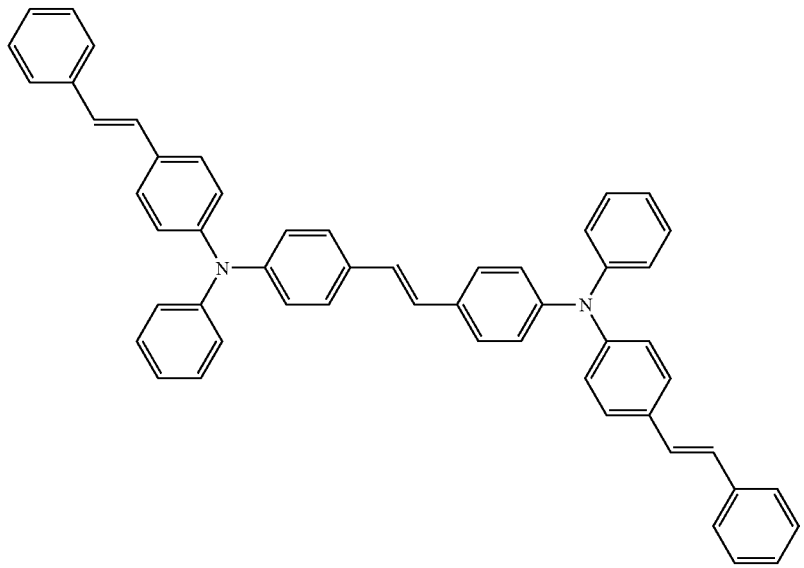
[5]

The organic EL element thus formed on the substrate was moved in a dry box through which dried nitrogen flowed without contacting to the atmosphere. In this dry box, a display part was covered with a sealing substrate 720 of blue glass plate and a cation curable adhesive (TB3102, Three Bond Co., Ltd.) was photo-cured about the periphery of the display part for sealing, thereby forming a full-color organic EL device 600 with an opening ratio of 56% wherein anode and cathode constituted an XY matrix.

In order to observe the emission properties only of the organic EL element, a monochrome organic EL device with an opening ratio of 56% was formed. It was formed under the same conditions as those of the full-color device 600 except that no color filters and color converting members were formed.

The arrow in FIG. 8 shows the direction of taking out light.

Example 6

Color and monochrome luminescence elements were produced in a manner similar to Example 5 except that a blue emitting layer was formed from the materials H and A at a ratio of 35:0.8.

Example 7

Color and monochrome luminescence elements were produced in a manner similar to Example 5 except that a blue emitting layer was formed from the materials H and A at a ratio of 35:0.6.

Example 8

Color and monochrome luminescence elements were produced in a manner similar to Example 5 except that an emitting layer was of three-laminate of blue, green, yellow to red emitting layers, which layers were formed in the following order.

Blue emitting layer: The materials H and A were used at a ratio of 5:0.07. It had a thickness of 5 nm.
Green emitting layer: The material H and material D of the formula [6] below were used at a ratio of 10:0.13. It had a thickness of 10 nm.
Yellow to red emitting layer: The materials H and B were used at a ratio of 25:1.25. It had a thickness of 25 nm.

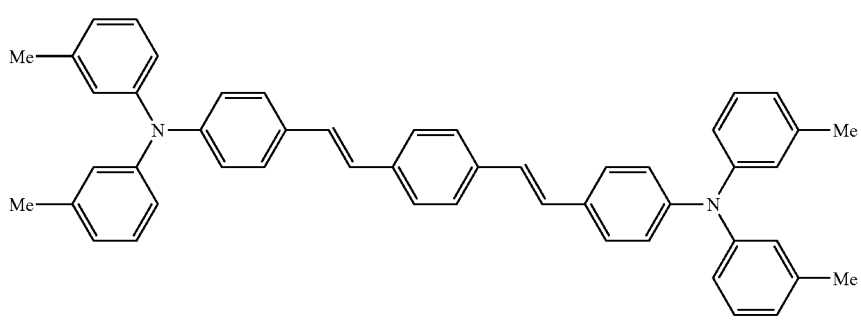
[6]

Comparative Example 3

Color and monochrome luminescence elements were produced in a manner similar to Example 5 except that a blue emitting layer was formed from the materials H and A at a ratio of 35:0.4.

Comparative Example 4

Full-color and monochrome luminescence elements were produced in a manner similar to Example 5 except that a blue emitting layer was changed as shown below and a yellow to red emitting layer was not formed.
Blue emitting layer: The materials H and A were used at a ratio of 40:1. It had a thickness of 40 nm.

Comparative Example 5

Color and monochrome luminescence elements were produced in a manner similar to Example 5 except that a blue emitting layer was changed as shown below and a yellow to red emitting layer was not formed.
Blue emitting layer: The materials H and D were used at a ratio of 40:1. It had a thickness of 40 nm.

Comparative Example 6

Color and monochrome luminescence elements were produced in a manner similar to Comparative Example 5 except that a second blue color filter was laminated on the BCF1 in a manner shown below.

Rhodamine Zn was dissolved in an acrylic negative photoresist (V259PA, Nippon Steel Chemical Co., Ltd.) at a Rhodamine Zn concentration of 0.08 mol/kg (solids) to prepare ink.

This ink was spin-coated on a substrate with all color filters formed thereon. The resultant substrate was exposed to ultraviolet rays with the same photo mask as that used to form the color filter above the blue filter (BCF1), developed with a 2% aqueous solution of sodium carbonate and baked at 180° C. to form the pattern of a blue converting member (film thickness 10 μm), referred to as BCF2 hereinafter.

The transmittance inside the pattern of BCF2 was measured by microspectrophotometry. FIG. 9(D) shows the results.

Evaluation Test 1

[Relationship Between the Luminescence Intensity Ratio of Blue Component to Yellow to Red Component, and the Chromaticity of Color Emission Device]

When a direct voltage of 5V was applied across an anode and a cathode in the monochrome organic EL devices of Examples 5 to 8 and Comparative Examples 3 to 5, the intersections of electrodes, pixels, each emitted light. The emission spectra were measured with a spectral radiometer (CS-1000, MINOLTA Co., Ltd.) and current values were simultaneously measured with a multimeter.

Figure 11:
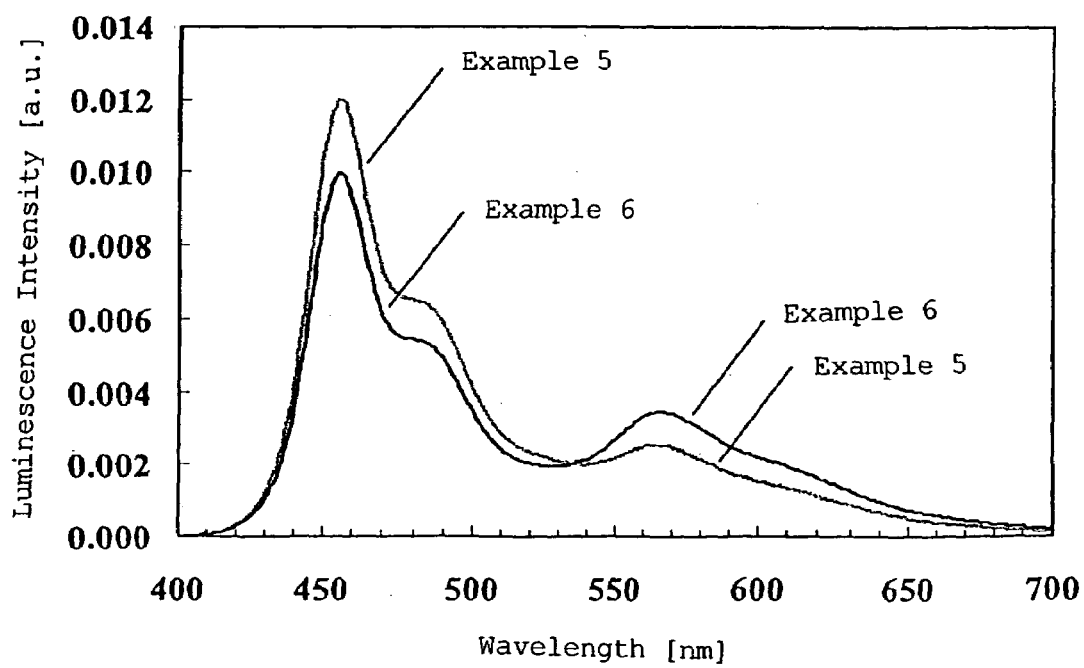
FIG. 11 shows the emission spectra of monochrome devices of Examples 5 to 6.

As a result, the current density was about 1 mA/cm$^2$ and the external quantum yield was about 5% in all the devices. FIG. 11 shows the emission spectra at this time of Examples 5 to 6, FIG. 12 shows those of Examples 7 to 8 and FIG. 13 shows those of Comparative Examples 3 to 5.

Figure 12:
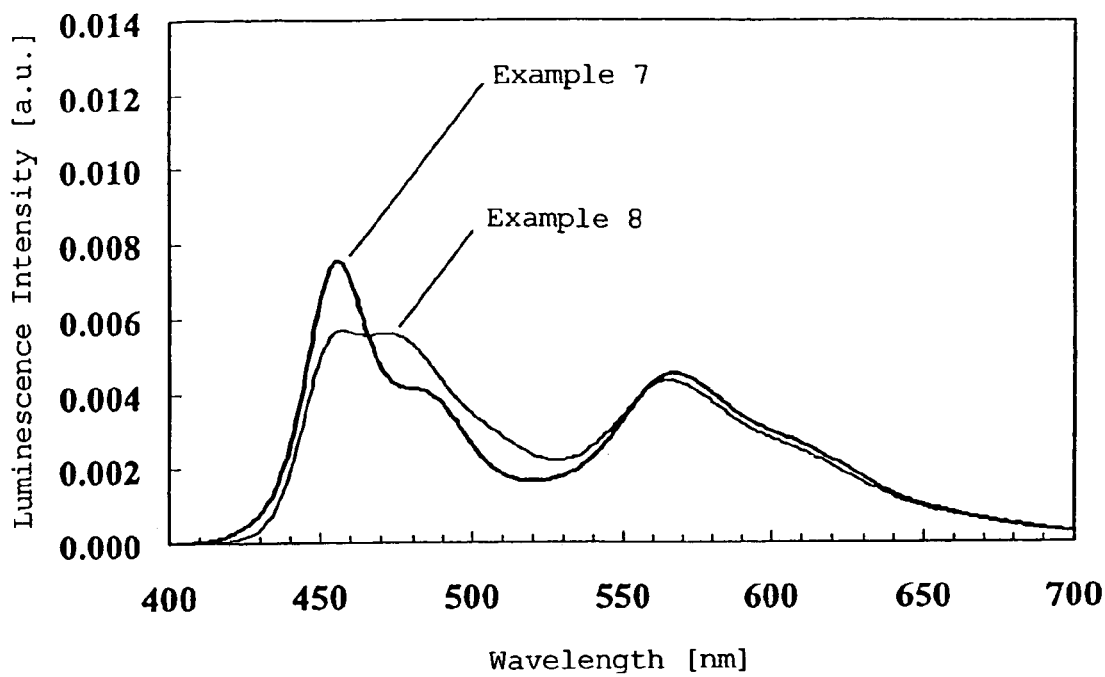
FIG. 12 shows the emission spectra of monochrome devices of Examples 7 to 8.
Figure 13:
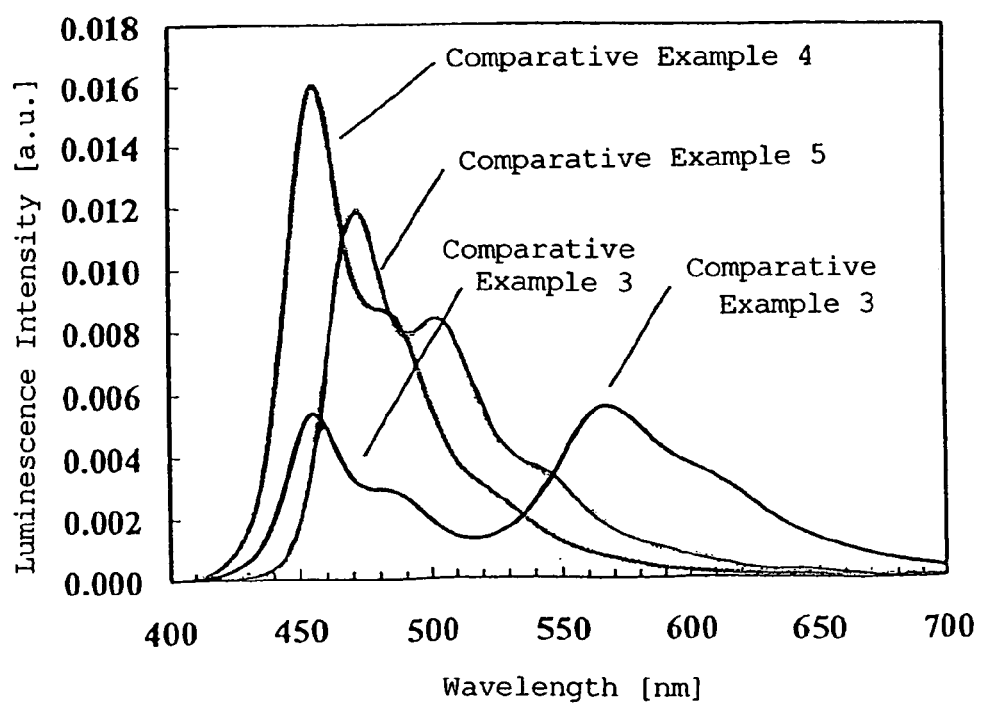
FIG. 13 shows the emission spectra of monochrome devices of Comparative Examples 3 to 5.

The ratio of the luminescence intensity of a blue component to that of a yellow to red component was determined based on FIGS. 11 to 13, which components were emitted by an organic EL element in the devices of the Examples and Comparative Examples.

The peak wavelengths of emissions of blue and yellow to red components were 455 nm and 565 nm, respectively, in Examples 5 to 8. The luminescence intensity ratio of blue component to yellow to red component of Example 5 was 0.83:0.17, that of Example 6 was 0.74:0.26, that of Example 7 was 0.63:0.37, and that of Example 8 was 0.57:0.43.

The peak wavelengths of emissions of blue and yellow to red components were 455 nm and 567 nm, respectively, in Comparative Example 3. Its luminescence intensity ratio of blue component to yellow to red component was 0.49:0.51.

The peak wavelength of emission of blue component was 455 nm, while that of yellow to red component was not observed in Comparative Example 4. Its luminescence intensity ratio of blue component to yellow to red component was 1:0.

The peak wavelength of emission of blue component was 472 nm, while that of yellow to red component was not observed in Comparative Example 5. Its luminescence intensity ratio of blue component to yellow to red component was 1:0.

The full-color organic EL devices of Examples 5 to 8 and Comparative Examples 3 to 6 were let to emit light under the same driving conditions as those of monochrome devices. Table 3 shows the properties at this time.

In Table 3, the full-color red (green, blue) shows the luminance and chromaticity in the case of lighting only red (green, blue) pixels. The full-color white shows the luminance and chromaticity in the case of lighting all the pixels.

Comparative Example 5 produced a color emission device with an organic EL element that emitted only a blue to green component.

Full-color could not be obtained in Comparative Example 5 since the chromaticity of white and blue was bad although the luminance of white was the highest.

In Comparative Example 6 where the BCF2 was laminated on the BCF1 to adjust the chromaticity of blue, the luminance of white was lowered and the chromaticity of white remained bad to a degree similar to Comparative Example 5.

Examples 5 to 8 and Comparative Example 3 produced color emission devices with organic EL elements that emitted blue and yellow to red components.

The chromaticity of red, green and blue sufficient for full-color was shown in these devices. However the chromaticity X, Y of white was too large in Comparative Example 3 since the luminescence intensity ratio of blue component to yellow to red component was 0.5:0.5 or the red component was strong.

In contrast, the chromaticity of white was satisfactory in Examples 5 to 8 since the luminescence intensity ratio of blue component to yellow to red component was 0.9:0.1 to 0.5:0.5

TABLE 3

| | Full-color Red | | | | Full-color Green | | | | Full-color Blue | | | | Full-color White | | | | Monochrome |
|---|---|---|---|---|---|---|---|---|---|---|---|---|---|---|---|---|---|
| | $\eta^R$ | L | CIEx | CIEy | $\eta^G$ | L | CIEx | CIEy | $\eta^B$ | L | CIEx | CIEy | $\eta^W$ | L | CIEx | CIEy | L |
| Exam. 5 | 27.3 | 8.6 | 0.639 | 0.351 | 66.1 | 20.9 | 0.333 | 0.632 | 25.0 | 7.9 | 0.134 | 0.105 | 39.4 | 37.4 | 0.277 | 0.281 | 94.7 |
| Exam. 6 | 26.8 | 9.6 | 0.641 | 0.352 | 62.3 | 22.2 | 0.358 | 0.615 | 19.6 | 7.0 | 0.136 | 0.110 | 36.2 | 38.7 | 0.308 | 0.306 | 106.9 |
| Exam. 7 | 26.3 | 10.7 | 0.643 | 0.352 | 58.6 | 23.8 | 0.382 | 0.597 | 14.5 | 5.9 | 0.140 | 0.120 | 33.2 | 40.4 | 0.349 | 0.338 | 121.7 |
| Exam. 8 | 26.1 | 11.0 | 0.635 | 0.361 | 60.7 | 25.6 | 0.333 | 0.597 | 18.9 | 8.0 | 0.132 | 0.143 | 35.2 | 44.5 | 0.318 | 0.035 | 126.4 |
| Com. Exam. 3 | 26.0 | 11.7 | 0.645 | 0.352 | 56.0 | 25.3 | 0.401 | 0.584 | 10.8 | 4.9 | 0.145 | 0.136 | 31.0 | 41.9 | 0.392 | 0.372 | 135.3 |
| Com. Exam. 4 | 28.8 | 6.7 | 0.633 | 0.351 | 77.9 | 18.2 | 0.266 | 0.679 | 41.4 | 9.7 | 0.132 | 0.098 | 49.4 | 34.6 | 0.223 | 0.239 | 70.2 |
| Com. Exam. 5 | 18.9 | 7.5 | 0.635 | 0.356 | 58.0 | 23.1 | 0.273 | 0.677 | 32.7 | 13.0 | 0.109 | 0.214 | 36.6 | 43.6 | 0.253 | 0.376 | 119.3 |
| Com. Exam. 6 | 18.9 | 7.5 | 0.635 | 0.356 | 58.0 | 23.1 | 0.273 | 0.677 | 16.5 | 6.5 | 0.112 | 0.142 | 31.1 | 37.2 | 0.275 | 0.366 | 119.3 |

L: Luminance [nit]
$\eta^R$: Luminance converting efficiency of red converting member [%]
$\eta^G$: Luminance converting efficiency of green converting member [%]
$\eta^B$: Luminance converting efficiency of blue converting member [%]
$\eta^W$: Luminance converting efficiency [%]

Example 9

Color and monochrome luminescence elements were produced in a manner similar to Example 5 except that the materials and layer thickness of blue and yellow to red emitting layers were changed as shown below. Yellow to red emitting layer: The materials H, B and A were used at a ratio of 5:0.02:0.1. It had a thickness of 5 nm. Blue emitting layer: The materials H and A were used at a ratio of 35:1. It had a thickness of 35 nm.

Example 10

A color luminescence element was produced in a manner similar to Example 5 except that the material of green filter was changed to a material of pigment type (CG-8510L, FUJIFILM Arch Co., Ltd., GCF2) and its thickness was changed to 1.0 μm.
The transmittance inside the pattern of GCF2 was measured by microspectrophotometry. FIG. 9(E) shows the results.

Example 11

A color luminescence element was produced in a manner similar to Example 10 except that the material of red filter was changed to a material of pigment type (CR7001, FUJIFILM Arch Co., Ltd., RCF2) and its thickness was changed to 1.5 μm.
The transmittance inside the pattern of RCF2 was measured by microspectrophotometry. FIG. 9(F) shows the results.

Evaluation Test 2
[Luminance, Chromaticity, Luminescence Efficiency, etc.]
When a pulse voltage with a duty ratio of 1/60 was applied across an anode and a cathode in the full-color organic EL devices of Examples 9 to 11 and Comparative Example 6, the intersections of electrodes, all the red, green and blue pixels, each emitted light.
The voltage value was adjusted with a spectral radiometer (CS-1000, MINOLTA Co., Ltd.) such that the luminance of white light was 80 nit. The chromaticity at this time was measured with the spectral radiometer and the current value was simultaneously measured with a multimeter.

Next the wiring was arranged such that only the same color pixels among the red, green and blue pixels emitted light, and the pulse voltage value was adjusted such that a current value measured with the multimeter was one third of that at the time of lighting all the pixels. The chromaticity at this time was measured with the spectral radiometer. Table 4 shows the results.

Figure 14:
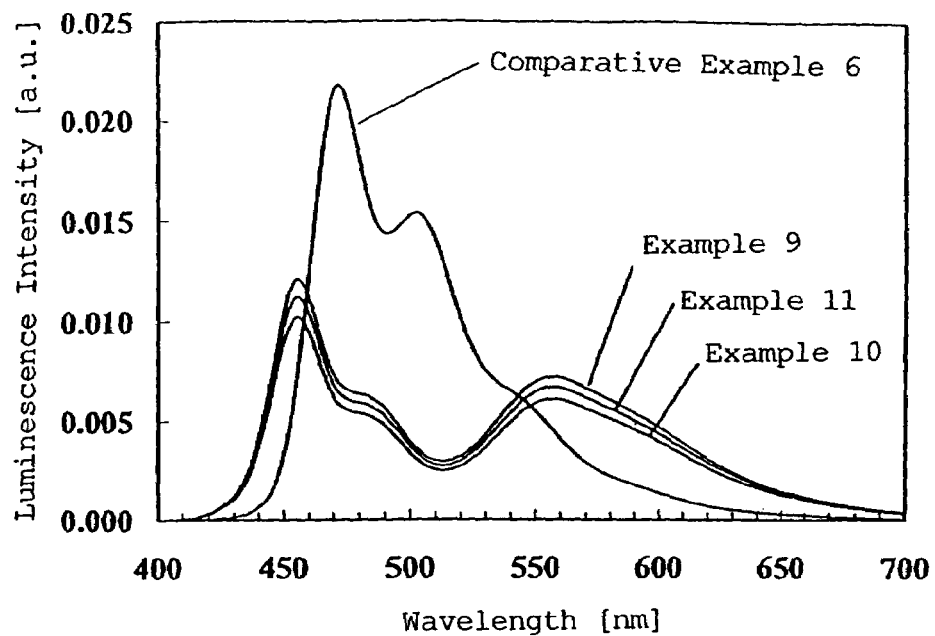
FIG. 14 shows the emission spectra of monochrome devices of Examples 9 to 11 and Comparative Example 6.

A pulse voltage of 1/60 was applied across an anode and a cathode in the monochrome organic EL devices of Example 9 and Comparative Example 6 under the same conditions as those at the time of lighting all the pixels at a luminance of 80 nit in the full-color devices. The monochrome devices of Examples 10 and 11 had the same structure of Example 9. Their emission spectra and luminances were measured with the spectral radiometer (CS-1000, MINOLTA Co., Ltd.). Table 4 shows the results.
FIG. 14 shows the emission spectra of the monochrome organic EL devices measured.
The ratio of the luminescence intensity of a blue component to that of a yellow to red component was determined based on FIG. 14, which components were emitted by an organic EL element in the devices.
The peak wavelengths of emissions of blue and yellow to red components were 455 nm and 557 nm, respectively, in Example 9, which was the same in Examples 10 and 11. The luminescence intensity ratio of blue component to yellow to red component was 0.63:0.37.
The peak wavelength of emission of blue component was 472 nm, while that of yellow to red component was not observed in Comparative Example 6. Its luminescence intensity ratio of blue component to yellow to red component was 1:0.
Apparently from FIG. 14, it was found that an extremely low luminescence intensity was required for a monochrome color emission device to obtain the same white luminance of a full-color device in Examples 9 to 11 compared with Comparative Example 6.
In addition, the degradation of a fluorescent dye in a color converting member could be suppressed since the intensity of light absorbed by the member was not needed to be high.

Apparently from Table 4, it was found that the full-color devices had the higher luminescence efficiency and power efficiency in Examples 9 to 11 compared with Comparative Example 6.

In Example 10 where the green filter had a transmittance of 80% or more at a wavelength of 540 nm, the full-color device had further higher efficiencies.

In Example 9 where the red filter had a transmittance of 50% or less at a wavelength of 600 nm, the chromaticity X of red exceeded 0.67.

The luminance $I_{mono}$ at this time was measured and thereafter the devices were set in the state of continuously lighting.

Then the following operations were repeated every 50 hours. The voltage value was adjusted so that the luminance coincided with the initial luminance in the monochrome emission device, the voltage value was thereafter adjusted to be the same voltage value in the full-color emission device emitting red light and the luminance at this time was measured.

TABLE 4

| | | Example 9 | | | | Example 10 | | | |
|---|---|---|---|---|---|---|---|---|---|
| | | η | L | CIE-x | CIE-y | η | L | CIE-x | CIE-y |
| Full-color device | Red | 26.1 | 20.6 | 0.643 | 0.352 | 26.1 | 17.3 | 0.643 | 0.352 |
| | Green | 59.4 | 46.9 | 0.376 | 0.602 | 79.1 | 52.3 | 0.356 | 0.580 |
| | Blue | 15.7 | 12.4 | 0.138 | 0.120 | 15.7 | 10.4 | 0.138 | 0.120 |
| | White | 33.8 | 80.0 | 0.339 | 0.333 | 40.3 | 80.0 | 0.335 | 0.354 |
| | Emission Efficiency | | 2.90 cd/A | | | | 3.51 cd/A | | |
| | Power Efficiency | | 0.78 lm/W | | | | 0.97 lm/W | | |
| | Voltage | | 11.7 V | | | | 11.3 V | | |
| Monochrome device | Luminance | | 237 nit | | | | 199 nit | | |
| | Emission Efficiency | | 8.6 cd/A | | | | 8.7 cd/A | | |

| | | Example 11 | | | | Comparative Example 6 | | | |
|---|---|---|---|---|---|---|---|---|---|
| | | η | L | CIE-x | CIE-y | η | L | CIE-x | CIE-y |
| Full-color device | Red | 15.0 | 10.9 | 0.675 | 0.324 | 18.9 | 16.2 | 0.635 | 0.356 |
| | Green | 79.1 | 57.7 | 0.356 | 0.580 | 58.0 | 49.7 | 0.273 | 0.677 |
| | Blue | 15.7 | 11.4 | 0.138 | 0.120 | 16.5 | 14.1 | 0.112 | 0.142 |
| | White | 36.6 | 80.0 | 0.312 | 0.350 | 31.1 | 80.0 | 0.275 | 0.366 |
| | Emission Efficiency | | 3.15 cd/A | | | | 2.77 cd/A | | |
| | Power Efficiency | | 0.85 lm/W | | | | 0.67 lm/W | | |
| | Voltage | | 11.6 V | | | | 13.0 V | | |
| Monochrome device | Luminance | | 219 nit | | | | 257 nit | | |
| | Emission Efficiency | | 8.6 cd/A | | | | 8.9 cd/A | | |

L: Luminance [nit]
η: Luminance converting efficiency [%]

[Continuous Driving Test of Color Emission Device]

A pulse voltage with a duty ratio of 1/60 was applied across an anode and a cathode in the full-color organic EL devices of Examples 9 to 11 and Comparative Example 6. The voltage value was adjusted with a spectral radiometer (CS-1000, MINOLTA Co., Ltd.) such that the luminance was 80 nit. The chromaticity at this time was measured with the spectral radiometer and the current value were simultaneously measured with a multimeter.

Next the wiring was arranged such that only the red pixels emitted light, and the pulse voltage value was adjusted such that a current value measured with the multimeter was one third of that at the time of lighting all the pixels. The luminance $I_{red}$ at this time was measured with the spectral radiometer and thereafter the devices were set in the state of continuously lighting.

A pulse voltage of 1/60 was applied across an anode and a cathode in the monochrome organic EL devices of Example 9 and Comparative Example 6 under the same conditions as those at the time of lighting only the red pixels in the full-color devices. The monochrome devices of Examples 10 and 11 had the same structure of Example 9.

Figure 15:
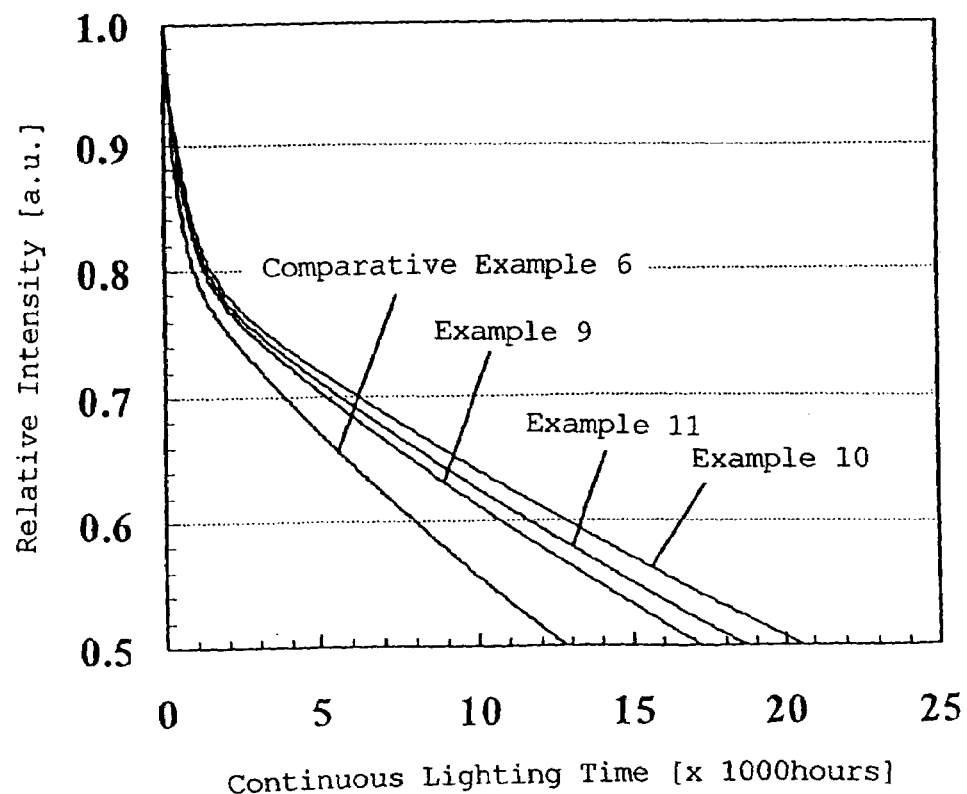
FIG. 15 shows changes with time in the luminance ratio $I_{red}/I_{mono}$ of a full-color device to a monochrome device.
Figure 16:
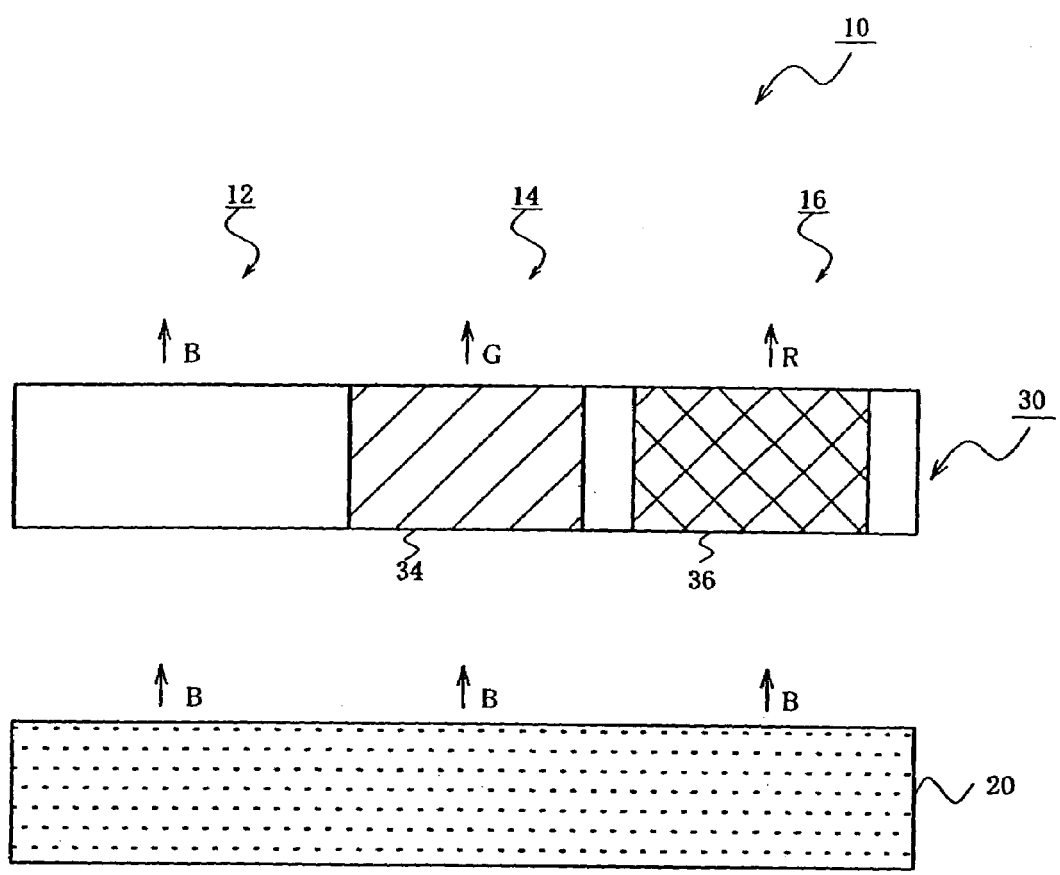
FIG. 16 is a diagram showing a color emission device of conventional art.

FIG. 15 shows changes with time in the luminance ratio $I_{red}/I_{mono}$ of a full-color device to a monochrome device. In FIG. 15, the initial luminance ratio $I_{red}/I_{mono}$ standardized as 1. The degree of degradation of only color converting member can be evaluated by this evaluation.

The half life of luminance ratio $I_{red}/I_{mono}$ was 13000 hours in Comparative Example 6, while it was 17000 hours in Example 9, it was 19000 hours in Example 11, and it was 21000 hours in Example 10. The half durability of red pixels significantly increased.

From these results, it was confirmed that the full-color emission devices had a high efficiency, high color reproducibility and long durability with low power consumption.

INDUSTRIAL UTILITY

As described in detail above, the invention can provide a color emission device that emits red light with a high intensity.

Further the invention can provide a color emission device with an excellent color purity, high emission efficiency and long durability.

The invention claimed is:

1. A color emission device comprising:
   an organic electroluminescence element that emits light having an emission spectrum with peaks in a blue range and a range other than the blue range,
   a blue pixel containing a blue filter that transmits blue light,
   a green pixel containing a green converting member that converts at least one part of light emitted from the organic electroluminescence element to green light, and a green filter that transmits green light, and
   a red pixel containing a red converting member that converts at least one part of light emitted from the organic electroluminescence element to red light, and a red filter that transmits red light,
   at least one peak of an excitation spectrum of the red converting member coinciding with the peak in the range other than the blue range of the organic electroluminescence element.

2. The color emission device according to claim 1, wherein a ratio of a peak intensity in the blue range to a peak intensity in the range other than the blue range as to the emission spectrum is 9:1 to 5:5.

3. The color emission device according to claim 1, wherein the peak in the blue range is a peak in 400 to 500 nm, and the peak in the range other than the blue range is a peak in 500 to 600 nm.

4. A color emission device comprising:
   a luminescence element, that emits light having a blue component and a yellow to red component in a luminescence intensity ratio of the blue component to the yellow to red component of 9:1 to 5:5, and
   a blue converting member, a green converting member, and a red converting member that emit blue light, green light, and red light, respectively upon receiving light emitted from the luminescence element.

5. The color emission device according to claim 4, wherein a luminance converting efficiency of the green converting member to a luminance of light emitted from the luminescence element is 50% or more.

6. The color emission device according to claim 4, wherein a luminance converting efficiency of the red converting member to a luminance of light emitted from the luminescence element is 10% or more.

7. The color emission device according to claim 4, wherein the red converting member comprises a laminate of a fluorescent converting layer and a color filter layer along a direction of taking out light, the fluorescent converting layer absorbing a part of light emitted from the luminescence element to emit fluorescence having a longer wavelength, the color filter layer cutting off unnecessary light, and
   the color filter has a transmittance of 60% or less at a wavelength of 600 nm.

8. The color emission device according to claim 4, wherein the green converting member comprises a laminate of a fluorescent converting layer and a color filter layer along a direction of taking out light, the fluorescent converting layer absorbing a part of light emitted from the luminescence element to emit fluorescence having a longer wavelength, the color filter layer cutting off unnecessary light, and
   the color filter has a transmittance of 80% or more at a wavelength of 540 nm.

9. The color emission device according to claim 4, wherein the luminescence element is an organic electroluminescence element.

* * * * *